United States Patent
Ohyama et al.

(10) Patent No.: US 12,241,762 B2
(45) Date of Patent: Mar. 4, 2025

(54) MAGNETIC SENSOR

(71) Applicant: Panasonic Intellectual Property Management Co., Ltd., Osaka (JP)

(72) Inventors: Yuki Ohyama, Fukui (JP); Kazuhiro Kanda, Fukui (JP); Masahiko Ohbayashi, Osaka (JP); Hideyuki Tanigawa, Osaka (JP); Masataka Tagawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 15 days.

(21) Appl. No.: 18/252,306

(22) PCT Filed: Nov. 16, 2021

(86) PCT No.: PCT/JP2021/042085
§ 371 (c)(1),
(2) Date: May 9, 2023

(87) PCT Pub. No.: WO2022/107765
PCT Pub. Date: May 27, 2022

(65) Prior Publication Data
US 2024/0011799 A1  Jan. 11, 2024

Related U.S. Application Data

(60) Provisional application No. 63/117,154, filed on Nov. 23, 2020.

(30) Foreign Application Priority Data

Feb. 16, 2021  (JP) ................... 2021-022907
Apr. 6, 2021   (JP) ................... 2021-064976

(51) Int. Cl.
   *G01D 5/16* (2006.01)

(52) U.S. Cl.
   CPC ................... *G01D 5/16* (2013.01)

(58) Field of Classification Search
   CPC ........ H10N 50/00; H10N 50/10; H10N 50/80; G01D 5/12; G01D 5/14; G01D 5/42;
   (Continued)

(56) References Cited

U.S. PATENT DOCUMENTS

| 5,243,280 A | 9/1993 | Kusumi |
| 2003/0107373 A1 | 6/2003 | Van Zon |

(Continued)

FOREIGN PATENT DOCUMENTS

| CN | 01584504 A | 2/2005 |
| JP | H01-227482 A | 9/1989 |

(Continued)

OTHER PUBLICATIONS

International Search Report dated Jan. 11, 2022 issued in International Patent Application No. PCT/JP2021/042085 with English translation.

(Continued)

*Primary Examiner* — Huy Q Phan
*Assistant Examiner* — David B Frederiksen
(74) *Attorney, Agent, or Firm* — Rimon P.C.

(57) ABSTRACT

In a magnetic sensor according to the present disclosure, each of a plurality of magnetoresistance pattern portions includes a first resistance portion and a second resistance portion that are connected together in series. One of two resistance portions connects a first wiring portion and a second wiring portion of a first wiring pattern portion. The other of the two resistance portions connects a first wiring portion and a second wiring portion of a second wiring pattern portion. The two resistance portions are included in (Continued)

the plurality of first resistance portions and the plurality of second resistance portions and located at both ends in a first direction.

10 Claims, 8 Drawing Sheets

(58) Field of Classification Search
CPC .......... G01D 5/145; G01D 5/16; G01R 33/06; G01R 33/09; G01R 33/091–098
See application file for complete search history.

(56) References Cited

U.S. PATENT DOCUMENTS

| | | | |
|---|---|---|---|
| 2004/0189295 A1* | 9/2004 | Sato | G01R 33/09 |
| | | | 428/692.1 |
| 2005/0270020 A1* | 12/2005 | Peczalski | G01R 33/0206 |
| | | | 324/252 |
| 2007/0035293 A1 | 2/2007 | Fukuoka et al. | |
| 2013/0038421 A1 | 2/2013 | Kawasaki et al. | |
| 2014/0367813 A1 | 12/2014 | Ryu et al. | |
| 2018/0275217 A1* | 9/2018 | Uchida | G01R 33/091 |
| 2019/0393173 A1 | 12/2019 | Sunamoto et al. | |

FOREIGN PATENT DOCUMENTS

| | | |
|---|---|---|
| JP | H03-029875 A | 2/1991 |
| JP | H05-075180 A | 3/1993 |
| JP | H06-104504 A | 4/1994 |
| JP | H07-077531 A | 3/1995 |
| JP | H07-226546 A | 8/1995 |
| JP | H08-068661 A | 3/1996 |
| JP | H09-260741 A | 10/1997 |
| JP | H11-148841 A | 6/1999 |
| JP | 2001-043981 A | 2/2001 |
| JP | 2001-141514 A | 5/2001 |
| JP | 2001-244521 A | 9/2001 |
| JP | 2005-227134 A | 8/2005 |
| JP | 2011-007569 A | 1/2011 |
| JP | 2011-146735 A | 7/2011 |
| JP | 2015-060954 A | 3/2015 |
| JP | 2016-211046 A | 12/2016 |
| JP | 2020-141091 A | 9/2020 |
| JP | 2020-178045 A | 10/2020 |
| JP | 2020-187064 A | 11/2020 |
| WO | 2018/150971 A1 | 8/2018 |
| WO | 2019/111547 A1 | 6/2019 |

OTHER PUBLICATIONS

International Search Report dated Jan. 11, 2022 issued in International Patent Application No. PCT/JP2021/042083, with English translation.

International Search Report dated Feb. 1, 2022 issued in International Patent Application No. PCT/JP2021/042084, with English translation.

International Search Report dated Jan. 18, 2022 issued in International Patent Application No. PCT/JP2021/042086, with English translation.

Notice of Allowance dated Dec. 10, 2024 issued in related U.S. Appl. No. 18/252,150.

* cited by examiner

MAGNETIC SENSOR

CROSS-REFERENCE OF RELATED APPLICATIONS

This application is the U.S. National Phase under 35 U.S.C. § 371 of International Patent Application No. PCT/JP2021/042085, filed on Nov. 16, 2021, which in turn claims the benefit of Japanese Patent Application No. 2021-022907, filed on Feb. 16, 2021, Japanese Patent Application No. 2021-064976, filed on Apr. 6, 2021, and U.S. Provisional Patent Application No. 63/117,154, filed on Nov. 23, 2020, the entire disclosures of which Applications are incorporated by reference herein.

TECHNICAL FIELD

The present disclosure generally relates to a magnetic sensor, and more particularly relates to a magnetic sensor including a plurality of magnetoresistance pattern portions.

BACKGROUND ART

Patent Literature 1 discloses a magnetic sensor including a flexible assembly in which a magnetic detection unit, a thin film conductor (wiring pattern portion), and electrode terminals (including power supply terminals and ground terminals) are formed on a flexible substrate.

The magnetic detection unit includes four patterns (magnetoresistance pattern portions) which are arranged side by side in a moving direction (first direction) of a magnetic medium (detection target). Two patterns, which are located at both ends in the moving direction, out of the four patterns each include an extended portion, which is extended outside of the pattern in a direction (second direction) intersecting with the moving direction and which forms part of the thin film conductor.

Patent Literature 2 discloses a magnetoresistive element (magnetic sensor) including a plurality of double meandering magneto-sensitive pattern units (magnetoresistance pattern portions).

Each of the plurality of double meandering magneto-sensitive pattern units includes a plurality of main magneto-sensitive portions and a plurality of sub-magneto-sensitive portions. In each of the plurality of double meandering magneto-sensitive pattern units, each of the plurality of main magneto-sensitive portions is formed in the first direction that is a direction in which a magnet (as a detection target) moves with respect to the magnetoresistive element. The plurality of main magneto-sensitive portions are arranged side by side in the second direction perpendicular to the first direction. Each of the plurality of sub-magneto-sensitive portions is formed in the second direction. The plurality of sub-magneto-sensitive portions alternately connects either respective first end portions or respective second end portions in the first direction of two adjacent main magneto-sensitive portions, out of the plurality of main magneto-sensitive portions.

CITATION LIST

Patent Literature

Patent Literature 1: JP 2005-227134 A
Patent Literature 2: JP 2001-141514 A

SUMMARY OF INVENTION

In the magnetic sensor, if the thin film conductor is made of the same material as the four patterns, for example, the resistance value of the extended portions of the thin film conductor varies as the magnetic medium moves in the moving direction, thus causing a decline in the positioning accuracy of the magnetic medium.

Nevertheless, if the thin film conductor is made of a material with no magnetoresistance effects, which is different from the material of the four patterns, to reduce the chances of causing a decline in the positioning accuracy of the magnetic medium, then the process step of forming the four patterns and the process step of forming the thin film conductor need to be performed, thus causing an increase in the number of manufacturing process steps required.

It is therefore an object of the present disclosure to provide a magnetic sensor with the ability to reduce the chances of causing a decline in the positioning accuracy of the detection target while reducing an increase in the number of manufacturing process steps.

A magnetic sensor according to an aspect of the present disclosure detects a position of a detection target based on a change in magnetic field strength to be caused by relative movement of the detection target in a first direction. The magnetic sensor includes a plurality of magnetoresistance pattern portions, a first wiring pattern portion, and a second wiring pattern portion. The plurality of magnetoresistance pattern portions forms a bridge circuit. The first wiring pattern portion is connected to a power supply terminal. The second wiring pattern portion is connected to a ground terminal. Each of the first wiring pattern portion and the second wiring pattern portion is made of the same material as the plurality of magnetoresistance pattern portions. The plurality of magnetoresistance pattern portions are arranged in the first direction. Each of the plurality of magnetoresistance pattern portions includes a first resistance portion and a second resistance portion that are connected together in series. Each of a plurality of the first resistance portions and a plurality of the second resistance portions included in the plurality of magnetoresistance pattern portions is formed in a second direction perpendicular to the first direction. Each of the first wiring pattern portion and the second wiring pattern portion includes a first wiring portion and a second wiring portion arranged on both sides of the plurality of magnetoresistance pattern portions in the second direction. Two resistance portions included in the plurality of the first resistance portions and the plurality of the second resistance portions are located at both ends in the first direction. One of the two resistance portions connects together the first wiring portion and the second wiring portion of the first wiring pattern portion. The other of the two resistance portions connects together the first wiring portion and the second wiring portion of the second wiring pattern portion.

DESCRIPTION OF EMBODIMENTS

Figure 1:
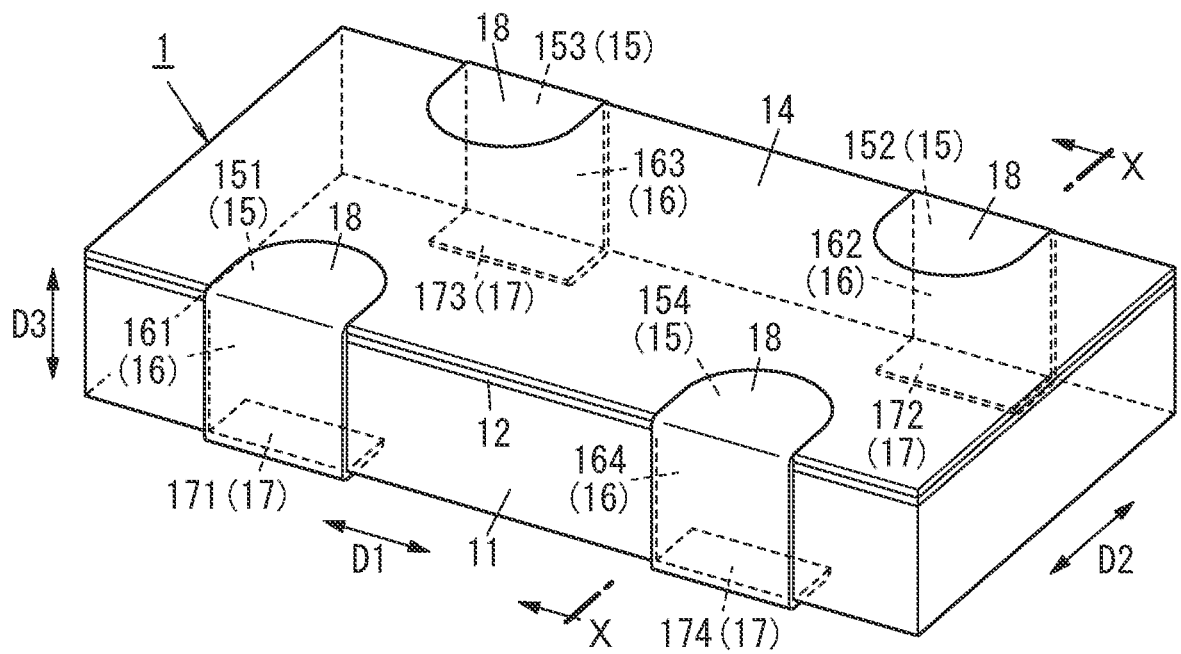
FIG. 1 is a perspective view illustrating the appearance of a magnetic sensor according to a first embodiment.

A magnetic sensor 1 according to first and second embodiments will be described with reference to FIGS. 1-8. FIGS. 1, 2, 4, and FIGS. 5-8 to be referred to in the following description of embodiments and their variations are all schematic representations. Thus, the ratio of the dimensions (including thicknesses) of respective constituent elements illustrated on the drawings does not always reflect their actual dimensional ratio.

First Embodiment (1) Overview

First, an overview of a magnetic sensor 1 according to a first embodiment will be described with reference to FIGS. 1-4.

The magnetic sensor 1 detects the position of a detection target 2 (refer to FIG. 5) using magnetism. The magnetic sensor 1 may be used as, for example, a position sensor such as a linear encoder or a rotary encoder. More specifically, the magnetic sensor 1 may be used as, for example, a position sensor (encoder) for detecting, for example, the position of a camera lens driven by a motor (such as a linear motor or a rotary motor). Alternatively, the magnetic sensor 1 may also be used as, for example, a position sensor for detecting the position of a brake pedal, a brake lever, or a gear shift of an automobile. However, these are only exemplary uses of the magnetic sensor 1 and should not be construed as limiting. As used herein, the "position" to be detected by the magnetic sensor 1 is a concept encompassing both the coordinates of the detection target 2 and the rotational angle defined by the detection target 2 around a rotational axis (virtual axis) passing through the detection target 2 (i.e., the orientation of the detection target 2). That is to say, the magnetic sensor 1 detects at least one of the coordinates of the detection target 2 or the rotational angle defined by the detection target 2.

In the following description, an embodiment in which the magnetic sensor 1 is used as a linear encoder will be described as an example. The linear encoder may be an increment type or an absolute type, whichever is appropriate. In this embodiment, the magnetic sensor 1 detects the coordinates of the detection target 2.

In a nutshell, a magnetic sensor 1 according to the first embodiment detects the position of the detection target 2 based on a change in magnetic field strength to be caused by relative movement of the detection target 2 in a first direction D1. The magnetic sensor 1 includes a plurality of magnetoresistance pattern portions 131-134, a first wiring pattern portion 135, and a second wiring pattern portion 136. The plurality of magnetoresistance pattern portions 131-134 form a bridge circuit. The first wiring pattern portion 135 is connected to a power supply terminal 21. The second wiring pattern portion 136 is connected to a ground terminal 22.

Each of the first wiring pattern portion 135 and the second wiring pattern portion 136 is made of the same material as the plurality of magnetoresistance pattern portions 131-134. The plurality of magnetoresistance pattern portions 131-134 are arranged in the first direction D1. Each of the plurality of magnetoresistance pattern portions 131-134 includes a first resistance portion 1311, 1321, 1331, 1341 and a second resistance portion 1312, 1322, 1332, 1342 that are connected together in series. Each of the first resistance portions 1311, 1321, 1331, 1341 and the second resistance portions 1312, 1322, 1332, 1342 is formed in a second direction D2 perpendicular to the first direction D1.

Each of the first wiring pattern portion 135 and the second wiring pattern portion 136 includes a first wiring portion 1351, 1361 and a second wiring portion 1352, 1362 arranged on both sides of the plurality of magnetoresistance pattern portions 131-134 in the second direction D2. In the plurality of magnetoresistance pattern portions 131-134, one of two resistance portions 1311, 1341, included in the plurality of first resistance portions 1311, 1321, 1331, 1341 and the plurality of second resistance portions 1312, 1322, 1332, 1342 and located at both ends in the first direction D1, connects together the first wiring portion 1351 and the second wiring portion 1352 of the first wiring pattern portion 135. The other of the two resistance portions 1311, 1341 connects together the first wiring portion 1361 and the second wiring portion 1362 of the second wiring pattern portion 136. As used herein, if something is "aligned with the first direction or the second direction," this expression refers to not only a situation where the thing is parallel to the first direction or the second direction but also a situation where the thing forms a predetermined angle (of 5 degrees, for example) with respect to either the first direction or the second direction.

In the magnetic sensor 1 according to the first embodiment, one of two resistance portions 1311, 1341 located at both ends in the first direction D1 connects together the first wiring portion 1351 and the second wiring portion 1352 of the first wiring pattern portion 135 as described above. The other of the two resistance portions 1311, 1341 connects together the first wiring portion 1361 and the second wiring portion 1362 of the second wiring pattern portion 136 as described above. This reduces the variation in the resistance value of the first wiring pattern portion 135 and the second wiring pattern portion 136 to be caused by the movement of the detection target 2 in the first direction D1. Consequently, this reduces the chances of causing a decline in the positioning accuracy of the detection target 2.

In addition, in the magnetic sensor 1 according to the first embodiment, each of the first wiring pattern portion 135 and the second wiring pattern portion 136 is made of the same material as the plurality of magnetoresistance pattern portions 131-134. This allows the first wiring pattern portion 135, the second wiring pattern portion 136, and the plurality of magnetoresistance pattern portions 131-134 to be formed in the same manufacturing process step, thus reducing an increase in the number of manufacturing process steps. Consequently, the magnetic sensor 1 according to the first embodiment may reduce the chances of causing a decline in the positioning accuracy of the detection target 2 while reducing an increase in the number of manufacturing process steps.

(2) Details

Next, the magnetic sensor 1 according to the first embodiment will be described in further detail with reference to FIGS. 1-5.

(2.1) Structure of Magnetic Sensor

First, the structure of the magnetic sensor 1 according to the first embodiment will be described with reference to FIGS. 1 and 2.

Figure 2:
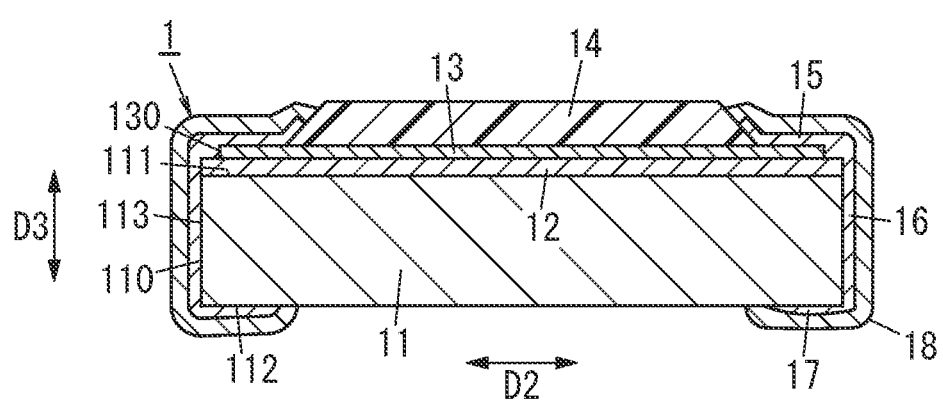
FIG. 2 is a cross-sectional view of the magnetic sensor as taken along a plane X-X shown in FIG. 1.

The magnetic sensor 1 according to the first embodiment is formed in the shape of a rectangular parallelepiped elongate in the first direction D1 as shown in FIGS. 1 and 2. In the following description, the first direction D1 is defined by the longitudinal axis (i.e., length) of the magnetic sensor 1, a second direction D2 is defined by the latitudinal axis (i.e., width) of the magnetic sensor 1, and a third direction D3 is defined by the thickness of the magnetic sensor 1. However, these directions should not be construed as limiting the direction in which the magnetic sensor 1 should be used. Also, the arrows indicating these directions D1, D2, and D3 on the drawings are shown there only for illustrative purposes and are insubstantial ones. In the first embodiment, the first direction D1 is a direction in which the magnetic sensor 1 moves with respect to the detection target 2. In the first embodiment, the first direction D1, the second direction D2, and the third direction D3 intersect with each other at right angles.

The magnetic sensor 1 according to the first embodiment includes a supporting substrate 11, a glass glazing layer 12, a magnetoresistive layer 13, and a protective coating 14 as shown in FIGS. 1 and 2. In addition, the magnetic sensor 1 according to the first embodiment further includes a plurality of (e.g., four) upper surface electrodes 15, a plurality of (e.g., four) end face electrodes 16, a plurality of (e.g., four) lower surface electrodes (backside electrodes) 17, and a plurality of (e.g., four) plating layers 18. The plurality of upper surface electrodes 15, the plurality of end face electrodes 16, and the plurality of lower surface electrodes 17 correspond one to one to each other.

The supporting substrate 11 may be a ceramic substrate, for example. A material for the ceramic substrate may be, for example, sintered alumina, of which the content of alumina is equal to or greater than 96%. The supporting substrate 11 is formed in the shape of a rectangular plate which is elongate in the first direction D1 defined by the longitudinal axis of the magnetic sensor 1 when viewed in the third direction D3 defined by the thickness of the magnetic sensor 1. As shown in FIG. 2, the supporting substrate 11 has a first principal surface 111, a second principal surface 112, and outer peripheral surfaces 113. Each of the first principal surface 111 and the second principal surface 112 is a planar surface aligned with both the first direction D1 and the second direction D2. The first principal surface 111 and the second principal surface 112 face each other in the third direction D3. The outer peripheral surfaces 113 are planar surfaces aligned with the third direction D3.

The glass glazing layer 12 may contain, for example, silicon dioxide as a main component thereof. The glass glazing layer 12 is formed on the first principal surface 111 of the supporting substrate 11. Specifically, the glass glazing layer 12 is formed over the entire first principal surface 111 of the supporting substrate 11. The glass glazing layer 12 is formed in the shape of a rectangular layer which is elongate in the first direction D1 when viewed in the third direction D3. In the magnetic sensor 1 according to the first embodiment, the glass glazing layer 12 makes the planar surface, on which the magnetoresistive layer 13 is formed, sufficiently smooth. Note that the glass glazing layer 12 only needs to be provided in a region where the plurality of magnetoresistance pattern portions 131-134 are arranged. Optionally, the glass glazing layer 12 may include a lead oxide.

The magnetoresistive layer 13 is formed on the glass glazing layer 12 as shown in FIG. 2. The magnetoresistive layer 13 includes a plurality of first layers and a plurality of second layers. Each of the plurality of first layers is a magnetic layer and may contain, for example, an NiFeCo alloy. Each of the plurality of second layers is a non-magnetic layer and may contain, for example, a Cu alloy. The plurality of first layers and the plurality of second layers are alternately stacked one on top of another on the glass glazing layer 12. In the magnetic sensor 1 according to the first embodiment, a giant magnetoresistive (GMR) film is formed by the magnetoresistive layer 13. The number of the first layers provided may be the same as, or different from, the number of the second layers provided, whichever is appropriate. In the magnetic sensor 1 according to the first embodiment, when viewed in plan in the third direction D3, the outer edges 130 of the magnetoresistive layer 13 are located inside the outer edges 110 of the supporting substrate 11.

The protective coating 14 is a coating for protecting the magnetoresistive layer 13. A material for the protective coating 14 may be an epoxy resin, for example. The protective coating 14 is formed over the glass glazing layer 12 to cover the magnetoresistive layer 13 partially. In the magnetic sensor 1 according to the first embodiment, the power supply terminal 21 and the ground terminal 22 (to be described later) and the first output terminal 23 and the second output terminal 24 (refer to FIGS. 3 and 4) are each connected to any of the plurality of upper surface electrodes 15. Thus, the protective coating 14 is provided to cover the magnetoresistive layer 13 entirely but at least the power supply terminal 21, the ground terminal 22, the first output terminal 23, and the second output terminal 24.

The plurality of upper surface electrodes 15 are formed on the first principal surface 111 (refer to FIG. 2) of the supporting substrate 11 as shown in FIG. 1. A material for the plurality of upper surface electrodes 15 may be, for example, a CuNi (copper-nickel) based alloy. The plurality of upper surface electrodes 15 includes a first upper surface electrode 151, a second upper surface electrode 152, a third upper surface electrode 153, and a fourth upper surface electrode 154. Each of the plurality of upper surface electrodes 15 is connected to any of the power supply terminal 21, the ground terminal 22, the first output terminal 23, or the second output terminal 24 in the magnetoresistive layer 13. More specifically, among the plurality of upper surface electrodes 15, the first upper surface electrode 151 is connected to the power supply terminal 21. The second upper surface electrode 152 is connected to the ground terminal 22. Also, among the plurality of upper surface electrodes 15, the third upper surface electrode 153 is connected to the first output terminal 23. The fourth upper surface electrode 154 is connected to the second output terminal 24. The plurality of upper surface electrodes 15 may be, for example, a sputtered film formed by sputtering.

The plurality of end face electrodes 16 is formed to cover two outer peripheral surfaces 113 (refer to FIG. 2), which are aligned with the longitudinal axis of the supporting substrate 11, in the first direction D1 as shown in FIG. 1. A material for the plurality of end face electrodes 16 may be, for example, a CuNi (copper-nickel) based alloy. The plurality of end face electrodes 16 includes a first end face electrode 161, a second end face electrode 162, a third end face electrode 163, and a fourth end face electrode 164. The plurality of end face electrodes 16 correspond one to one to the plurality of upper surface electrodes 15 as described above. More specifically, the first end face electrode 161 corresponds to, and is connected to, the first upper surface electrode 151. The second end face electrode 162 corresponds to, and is connected to, the second upper surface electrode 152. The third end face electrode 163 corresponds to, and is connected to, the third upper surface electrode 153. The fourth end face electrode 164 corresponds to, and is connected to, the fourth upper surface electrode 154. The plurality of end face electrodes 16 may be, for example, a sputtered film formed by sputtering.

The plurality of lower surface electrodes 17 is formed on the second principal surface 112 (refer to FIG. 2) of the supporting substrate 11 as shown in FIG. 1. A material for the plurality of lower surface electrodes 17 may be, for example, a CuNi (copper-nickel) based alloy. The plurality of lower surface electrodes 17 includes a first lower surface electrode 171, a second lower surface electrode 172, a third lower surface electrode 173, and a fourth lower surface electrode 174. The plurality of lower surface electrodes 17 correspond one to one to the plurality of upper surface electrodes 15 and the plurality of end face electrodes 16 as described above. More specifically, the first lower surface electrode 171 corresponds to the first upper surface electrode 151 and the first end face electrode 161 and is connected to the first end face electrode 161. The second lower surface electrode 172 corresponds to the second upper surface electrode 152 and the second end face electrode 162 and is connected to the second end face electrode 162. The third lower surface electrode 173 corresponds to the third upper surface electrode 153 and the third end face electrode 163 and is connected to the third end face electrode 163. The fourth lower surface electrode 174 corresponds to the fourth upper surface electrode 154 and the fourth end face electrode 164 and is connected to the fourth end face electrode 164. The plurality of lower surface electrodes 17 may be, for example, a sputtered film formed by sputtering.

In the magnetic sensor 1 according to the first embodiment, the first upper surface electrode 151, the first end face electrode 161, and the first lower surface electrode 171 are formed in a U-shape when viewed in the first direction D1. The second upper surface electrode 152, the second end face electrode 162, and the second lower surface electrode 172 are formed in a U-shape when viewed in the first direction D1. The third upper surface electrode 153, the third end face electrode 163, and the third lower surface electrode 173 are formed in a U-shape when viewed in the first direction D1. The fourth upper surface electrode 154, the fourth end face electrode 164, and the fourth lower surface electrode 174 are formed in a U-shape when viewed in the first direction D1.

The magnetic sensor 1 according to the first embodiment may be connected to a mount board, on which the magnetic sensor 1 is going to be mounted, via the plurality of lower surface electrodes 17.

Each of the plurality of plating layers 18 is formed to cover a corresponding one of the plurality of upper surface electrodes 15, a corresponding one of the plurality of end face electrodes 16, and a corresponding one of the plurality of lower surface electrodes 17 as shown in FIG. 1. That is to say, each of the plurality of plating layers 18 is formed in a U-shape when viewed in the first direction D1. Each of the plurality of plating layers 18 includes an electroplated copper layer and an electroplated tin layer. Each of the plurality of plating layers 18 is in contact with the protective coating 14 as shown in FIG. 2.

(2.2) Circuit Configuration for Magnetic Sensor

Next, a circuit configuration for the magnetic sensor 1 according to the first embodiment will be described with reference to FIG. 3.

Figure 3:
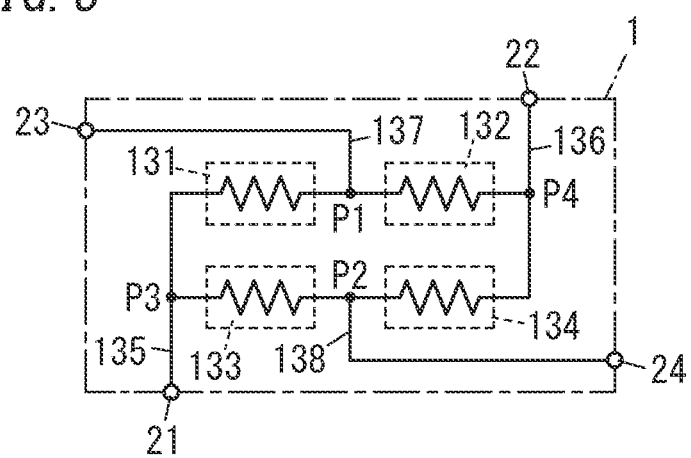
FIG. 3 is a schematic circuit diagram of the magnetic sensor.

The magnetic sensor 1 according to the first embodiment includes the plurality of (e.g., four in the example illustrated in FIG. 3) magnetoresistance pattern portions 131-134, the first wiring pattern portion 135, the second wiring pattern portion 136, a third wiring pattern portion 137, and a fourth wiring pattern portion 138 as shown in FIG. 3. In addition, the magnetic sensor 1 according to the first embodiment further includes the power supply terminal 21, the ground terminal 22, the first output terminal 23, and the second output terminal 24. The magnetic sensor 1 according to the first embodiment includes four magnetoresistance pattern portions 131-134 as the plurality of magnetoresistance pattern portions 131-134. The four magnetoresistance pattern portions 131-134 consist of a first magnetoresistance pattern portion 131, a second magnetoresistance pattern portion 132, a third magnetoresistance pattern portion 133, and a fourth magnetoresistance pattern portion 134.

The first magnetoresistance pattern portion 131, the second magnetoresistance pattern portion 132, the third magnetoresistance pattern portion 133, and the fourth magnetoresistance pattern portion 134 form a full bridge circuit. That is to say, the bridge circuit included in the magnetic sensor 1 is a full-bridge circuit consisting of the four magnetoresistance pattern portions 131-134. Specifically, a series circuit of the first magnetoresistance pattern portion 131 and the second magnetoresistance pattern portion 132 and a series circuit of the third magnetoresistance pattern portion 133 and the fourth magnetoresistance pattern portion 134 are connected to each other in parallel. In other words, the four magnetoresistance pattern portions 131-134 consist of: the first magnetoresistance pattern portion 131 and second magnetoresistance pattern portion 132 that are connected together in series; and the third magnetoresistance pattern portion 133 and fourth magnetoresistance pattern portion 134 that are connected together in series.

A connection node P1 between the first magnetoresistance pattern portion 131 and the second magnetoresistance pattern portion 132 is connected to the first output terminal 23 via the third wiring pattern portion 137. That is to say, the third wiring pattern portion 137 connected to the first output terminal 23 is connected to the connection node P1 between the first magnetoresistance pattern portion 131 and the second magnetoresistance pattern portion 132 that are connected together in series among the four magnetoresistance pattern portions 131-134. The other end portion (i.e., the left end portion in FIG. 3), located opposite from the end portion adjacent to the second magnetoresistance pattern portion 132, of the first magnetoresistance pattern portion 131 is connected to the power supply terminal 21 via the first wiring pattern portion 135. That is to say, the first wiring pattern portion 135 is connected to the power supply terminal 21. The other end portion (i.e., the right end portion in FIG. 3), located opposite from the end portion adjacent to the first magnetoresistance pattern portion 131, of the second magnetoresistance pattern portion 132 is connected to the ground terminal 22 via the second wiring pattern portion 136. That is to say, the second wiring pattern portion 136 is connected to the ground terminal 22.

A connection node P2 between the third magnetoresistance pattern portion 133 and the fourth magnetoresistance pattern portion 134 is connected to the second output terminal 24 via the fourth wiring pattern portion 138. That is to say, the fourth wiring pattern portion 138 connected to the second output terminal 24 is connected to the connection node P2 between the third magnetoresistance pattern portion 133 and fourth magnetoresistance pattern portion 134 that are connected together in series among the four magnetoresistance pattern portions 131-134. The other end portion (i.e., the left end portion in FIG. 3), located opposite from the end portion adjacent to the fourth magnetoresistance pattern portion 134, of the third magnetoresistance pattern portion 133 is connected to the power supply terminal 21 via the first wiring pattern portion 135. The other end portion (i.e., the right end portion in FIG. 3), located opposite from the end portion adjacent to the third magnetoresistance pattern portion 133, of the fourth magnetoresistance pattern portion 134 is connected to the ground terminal 22 via the second wiring pattern portion 136.

That is to say, in the magnetic sensor 1 according to the first embodiment, a connection node P3 between the first magnetoresistance pattern portion 131 and the third magnetoresistance pattern portion 133 is connected to the power supply terminal 21 via the first wiring pattern portion 135. In summary, the first wiring pattern portion 135 is connected to the other end portion, located opposite from the end portion adjacent to the second magnetoresistance pattern portion 132, of the first magnetoresistance pattern portion 131 and the other end portion, located opposite from the end portion adjacent to the fourth magnetoresistance pattern portion 134, of the third magnetoresistance pattern portion 133. In addition, in the magnetic sensor 1 according to the first embodiment, a connection node P4 between the second magnetoresistance pattern portion 132 and the fourth magnetoresistance pattern portion 134 is connected to the ground terminal 22 via the second wiring pattern portion 136. In summary, the second wiring pattern portion 136 is connected to the other end portion, located opposite from the end portion adjacent to the first magnetoresistance pattern portion 131, of the second magnetoresistance pattern portion 132 and the other end portion, located opposite from the end portion adjacent to the third magnetoresistance pattern portion 133, of the fourth magnetoresistance pattern portion 134.

The power supply terminal 21, the ground terminal 22, the first output terminal 23, and the second output terminal 24 correspond one to one to plurality of upper surface electrodes 15. Specifically, the power supply terminal 21 corresponds one to one to, and is connected to, the first upper surface electrode 151 out of the plurality of upper surface electrodes 15. The ground terminal 22 corresponds one to one to, and is connected to, the second upper surface electrode 152 out of the plurality of upper surface electrodes 15. The first output terminal 23 corresponds one to one to, and is connected to, the third upper surface electrode 153 out of the plurality of upper surface electrodes 15. The second output terminal 24 corresponds one to one to, and is connected to, the fourth upper surface electrode 154 out of the plurality of upper surface electrodes 15.

In the magnetic sensor 1 according to the first embodiment, the magnetoresistive layer 13 constitutes the plurality of magnetoresistance pattern portions 131-134, the first to fourth wiring pattern portions 135-138, and the four terminals 21-24. That is to say, in the magnetic sensor 1 according to the first embodiment, the first to fourth wiring pattern portions 135-138 that connect the plurality of magnetoresistance pattern portions 131-134 to the fourth terminals 21-24 are made of the same material as the plurality of magnetoresistance pattern portions 131-134. In short, each of the first wiring pattern portion 135 and the second wiring pattern portion 136 is made of the same material as the plurality of magnetoresistance pattern portions 131-134.

Figure 4:
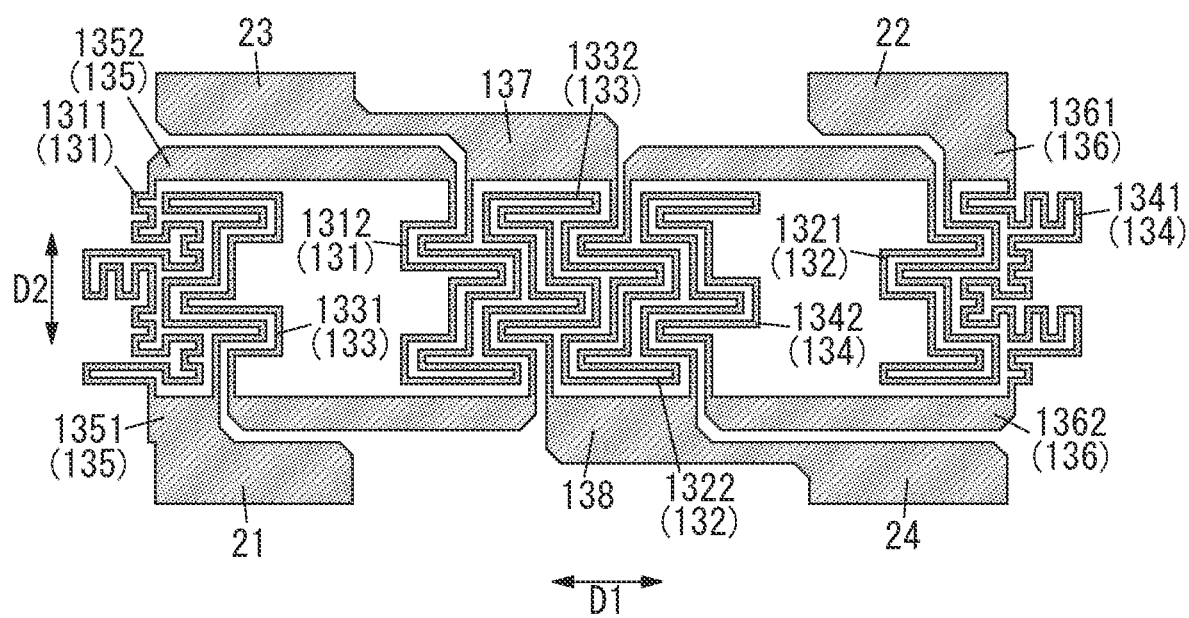
FIG. 4 illustrates an exemplary arrangement of magnetoresistance pattern portions, wiring pattern portions, and terminals in the magnetic sensor.

(2.3) Exemplary Arrangement of Magnetoresistance Pattern Portions, Wiring Pattern Portions, and Terminals Next, an exemplary arrangement of the plurality of magnetoresistance pattern portions 131-134, the first to fourth wiring pattern portions 135-138, and the four terminals 21-24 in the magnetic sensor 1 according to the first embodiment will be described with reference to FIG. 4. In FIG. 4, the magnetoresistance pattern portions 131-134, the first to fourth wiring pattern portions 135-138, and the four terminals 21-24 are shaded by dot hatching to be easily distinguished.

The plurality of magnetoresistance pattern portions 131-134 are arranged in the first direction D1 defined by the longitudinal axis of the magnetic sensor 1 as shown in FIG. 4.

The first magnetoresistance pattern portion 131 includes a first resistance portion 1311 and a second resistance portion 1312 as shown in FIG. 4. Each of the first resistance portion 1311 and the second resistance portion 1312 is formed in a meandering shape when viewed in the third direction D3 (i.e., a direction perpendicular to the paper sheet on which FIG. 4 is drawn). That is to say, each of the first resistance portion 1311 and the second resistance portion 1312 is formed in the shape of a river that meanders in the first direction D1 and the second direction D2 when viewed in the third direction D3. Each of the first resistance portion 1311 and the second resistance portion 1312 is formed in the second direction D2. That is to say, the longitudinal axis of each of the first resistance portion 1311 and the second resistance portion 1312 is aligned with the second direction D2. The first resistance portion 1311 and the second resistance portion 1312 are connected together in series. More specifically, the first resistance portion 1311 and the second resistance portion 1312 are connected together in series via a second wiring portion 1352 (to be described later) of the first wiring pattern portion 135.

The second magnetoresistance pattern portion 132 includes a first resistance portion 1321 and a second resistance portion 1322 as shown in FIG. 4. Each of the first resistance portion 1321 and the second resistance portion 1322 is formed in a meandering shape when viewed in the third direction D3. That is to say, each of the first resistance portion 1321 and the second resistance portion 1322 is formed in the shape of a river that meanders in the first direction D1 and the second direction D2 when viewed in the third direction D3. Each of the first resistance portion 1321 and the second resistance portion 1322 is formed in the second direction D2. That is to say, the longitudinal axis of each of the first resistance portion 1321 and the second resistance portion 1322 is aligned with the second direction D2. The first resistance portion 1321 and the second resistance portion 1322 are connected together in series.

The third magnetoresistance pattern portion 133 includes a first resistance portion 1331 and a second resistance portion 1332 as shown in FIG. 4. Each of the first resistance portion 1331 and the second resistance portion 1332 is formed in a meandering shape when viewed in the third direction D3. That is to say, each of the first resistance portion 1331 and the second resistance portion 1332 is formed in the shape of a river that meanders in the first direction D1 and the second direction D2 when viewed in the third direction D3. Each of the first resistance portion 1331 and the second resistance portion 1332 is formed in the second direction D2. That is to say, the longitudinal axis of each of the first resistance portion 1331 and the second resistance portion 1332 is aligned with the second direction D2. The first resistance portion 1331 and the second resistance portion 1332 are connected together in series.

The fourth magnetoresistance pattern portion 134 includes a first resistance portion 1341 and a second resistance portion 1342 as shown in FIG. 4. Each of the first resistance portion 1341 and the second resistance portion 1342 is formed in a meandering shape when viewed in the third direction D3. That is to say, each of the first resistance portion 1341 and the second resistance portion 1342 is formed in the shape of a river that meanders in the first direction D1 and the second direction D2 when viewed in the third direction D3. Each of the first resistance portion 1341 and the second resistance portion 1342 is formed in the second direction D2. That is to say, the longitudinal axis of each of the first resistance portion 1341 and the second resistance portion 1342 is aligned with the second direction D2. The first resistance portion 1341 and the second resistance portion 1342 are connected together in series. More specifically, the first resistance portion 1341 and the second resistance portion 1342 are connected together in series via a second wiring portion 1362 (to be described later) of the second wiring pattern portion 136.

In the magnetic sensor 1 according to the first embodiment, the plurality of magnetoresistance pattern portions 131-134 are arranged in the first direction D1 in the order of the first resistance portion 1311 of the first magnetoresistance pattern portion 131, the first resistance portion 1331 of the third magnetoresistance pattern portion 133, the second resistance portion 1312 of the first magnetoresistance pattern portion 131, the second resistance portion 1332 of the third magnetoresistance pattern portion 133, the second resistance portion 1322 of the second magnetoresistance pattern portion 132, the second resistance portion 1342 of the fourth magnetoresistance pattern portion 134, the first resistance portion 1321 of the second magnetoresistance pattern portion 132, and the first resistance portion 1341 of the fourth magnetoresistance pattern portion 134 from left to right as shown in FIG. 4. That is to say, the plurality of first resistance portions 1311, 1321, 1331, 1341 and the plurality of second resistance portions 1312, 1322, 1332, 1342 are arranged side by side in the first direction D1.

In this case, in the example shown in FIG. 4, among the plurality of first resistance portions 1311, 1321, 1331, 1341 and the plurality of second resistance portions 1312, 1322, 1332, 1342, the inner resistance portions 1321, 1331, 1312, 1322, 1332, 1342 are formed in the same shape when viewed in the third direction D3. As used herein, the "inner resistance portion" refers to a resistance portion adjacent to two other resistance portions that are arranged on both sides thereof in the first direction D1. That is to say, in the example shown in FIG. 4, the first resistance portions 1321, 1331 and the second resistance portions 1312, 1322, 1332, and 1342 are inner resistance portions. Also, as used herein, the "outer resistance portion" refers to a resistance portion adjacent to another resistance portion disposed on only one side thereof in the first direction DL. That is to say, in the example shown in FIG. 4, the first resistance portions 1311, 1341 are the outer resistance portions. Furthermore, as used herein, if two things "have the same shape," this expression refers to not only a situation where the two things have exactly the same shape but also a situation where their shapes are different to the extent that variations in their resistance value in response to a change in magnetic field strength distribution may be regarded as the same behavior. Therefore, the inner resistance portions 1321, 1331, 1312, 1322, 1332, 1342 may have mutually different shapes as long as variations in their resistance value in response to a change in magnetic field strength distribution may be regarded as the same behavior.

The first wiring pattern portion 135 includes a first wiring portion 1351 and a second wiring portion 1352 as shown in FIG. 4. The first wiring portion 1351 and the second wiring portion 1352 are located on both sides of the plurality of magnetoresistance pattern portions 131-134 in the second direction D2. In the example shown in FIG. 4, the first wiring portion 1351 is located under the plurality of magnetoresistance pattern portions 131-134 while the second wiring portion 1352 is located over the plurality of magnetoresistance pattern portions 131-134. Also, the first wiring portion 1351 is connected to the power supply terminal 21. The first wiring portion 1351 and the second wiring portion 1352 are connected to each other via the first resistance portion 1311 of the first magnetoresistance pattern portion 131.

The second wiring pattern portion 136 includes a first wiring portion 1361 and a second wiring portion 1362 as shown in FIG. 4. The first wiring portion 1361 and the second wiring portion 1362 are located on both sides of the plurality of magnetoresistance pattern portions 131-134 in the second direction D2. In the example shown in FIG. 4, the first wiring portion 1361 is located over the plurality of magnetoresistance pattern portions 131-134 while the second wiring portion 1362 is located under the plurality of magnetoresistance pattern portions 131-134. Also, the first wiring portion 1361 is connected to the ground terminal 22. The first wiring portion 1361 and the second wiring portion 1362 are connected to each other via the first resistance portion 1341 of the fourth magnetoresistance pattern portion 134.

The third wiring pattern portion 137 is connected to the first output terminal 23 as shown in FIG. 4. The fourth wiring pattern portion 138 is connected to the second output terminal 24 as shown in FIG. 4. The third wiring pattern portion 137 and the fourth wiring pattern portion 138 are located on both sides of the plurality of magnetoresistance pattern portions 131-134 in the second direction D2. In the example shown in FIG. 4, the third wiring pattern portion 137 is located over the plurality of magnetoresistance pattern portions 131-134 while the fourth wiring pattern portion 138 is located under the plurality of magnetoresistance pattern portions 131-134.

In the magnetic sensor 1 according to the first embodiment, the first resistance portion 1311, which is one of the two resistance portions 1311, 1341 located at both ends in the first direction D1 among the plurality of first resistance portions 1311, 1321, 1331, 1341 and the plurality of second resistance portions 1312, 1322, 1332, 1342, connects together the first wiring portion 1351 and second wiring portion 1352 of the first wiring pattern portion 135. On the other hand, the first resistance portion 1341, which is the other of the two resistance portions 1311, 1341, connects together the first wiring portion 1361 and second wiring portion 1362 of the second wiring pattern portion 136.

Figure 5:
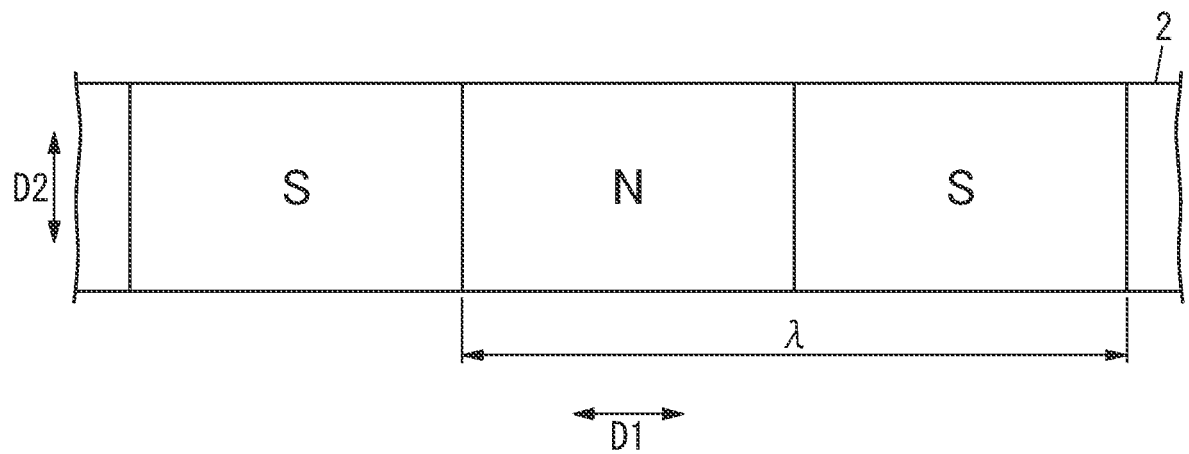
FIG. 5 schematically illustrates a configuration for a detection target for the magnetic sensor.

In this case, the detection target 2 may be a magnetic scale, for example. The detection target 2 is formed in the shape of a plate which is elongate in the first direction D1 as shown in FIG. 5. The detection target 2 faces the magnetic sensor 1 in the third direction D3 (i.e., the direction perpendicular to the paper sheet on which FIG. 5 is drawn). The detection target 2 includes a plurality of magnetic poles. The plurality of magnetic poles are arranged in the first direction D1. The plurality of magnetic poles includes one or more N poles and one or more S poles. The plurality of magnetic poles are arranged such that the one or more S poles and the one or more N poles are alternately arranged in the first direction D1. Each magnetic pole may be, for example, a ferrite magnet or a neodymium magnet. The detection target 2 includes a plurality of ferrite magnets or a plurality of neodymium magnets which are arranged in the first direction DL. The detection target 2 is magnetized in the first direction D1 in a cycle of magnetization λ as shown in FIG. 5.

In the first embodiment, as the magnetic sensor 1 moves in the first direction D1 with respect to the detection target 2, for example, the strength of the magnetic field between the magnetic sensor 1 and the detection target 2 changes. In response to this change in the magnetic field strength, the resistance values of the plurality of magnetoresistance pattern portions 131-134 vary. Then, the position of the detection target 2 may be detected by detecting potentials at the first output terminal 23 and the second output terminal 24. Note that the magnetic sensor 1 and the detection target 2 may be configured to move relative to each other. Thus, the magnetic sensor 1 and the detection target 2 may also be configured such that the detection target 2 moves relative to the magnetic sensor 1.

(3) Method for Manufacturing Magnetic Sensor

Next, a method for manufacturing a magnetic sensor 1 according to the first embodiment will be described.

The method for manufacturing the magnetic sensor 1 includes the following first through ninth steps.

A first step includes providing a supporting substrate 11. More specifically, the first step includes providing a wafer, which forms the basis of respective supporting substrates 11 of a plurality of magnetic sensors 1. The wafer may be a ceramic wafer, for example. A material for the ceramic wafer as an exemplary wafer may be, for example, sintered alumina, of which the content of alumina is equal to or greater than 96%.

A second step includes forming a glass glazing layer 12 on the first principal surface of the wafer. The first principal surface of the wafer is a surface that will be the first principal surface 111 of the supporting substrate 11 in each of the plurality of magnetic sensors 1. More specifically, the second step includes forming the glass glazing layer 12 by applying a glass paste onto the first principal surface 111 of the supporting substrate 11 and then firing the glass paste.

A third step includes forming a magnetoresistive layer 13 for the plurality of magnetic sensors 1. More specifically, the third step includes forming the magnetoresistive layer 13 on the glass glazing layer 12 by sputtering, for example. In the magnetic sensor 1 according to the first embodiment, the magnetoresistive layer 13 is formed as a GMR film as described above by alternately stacking a plurality of NiFeCo alloy layers (first layers) and a plurality of Cu alloy layers (second layers).

A fourth step includes forming a protective coating 14. More specifically, the fourth step includes applying an epoxy resin by screen printing onto the glass glazing layer 12 such that the magnetoresistive layer 13 is partially covered with the epoxy resin and then thermally curing the epoxy resin, thereby forming the protective coating 14. In this process step, the protective coating 14 is formed to cover the magnetoresistive layer 13 entirely but at least the power supply terminal 21, the ground terminal 22, the first output terminal 23, and the second output terminal 24.

A fifth step includes forming a plurality of upper surface electrodes 15 on the first principal surface of the wafer for each of the plurality of magnetic sensors 1. More specifically, the fifth step includes forming a CuNi based alloy film on the first principal surface of the wafer by sputtering, for example, thereby forming the plurality of upper surface electrodes 15 for each of the plurality of magnetic sensors 1.

A sixth step includes forming a plurality of lower surface electrodes 17 on the second principal surface of the wafer for each of the plurality of magnetic sensors 1. More specifically, the sixth step includes forming a CuNi based alloy film on the second principal surface of the wafer by sputtering, for example, thereby forming the plurality of lower surface electrodes 17 for each of the plurality of magnetic sensors 1. The second principal surface of the wafer is a surface that will be the second principal surface 112 of the supporting substrate 11 in each of the plurality of magnetic sensors 1.

A seventh step includes cutting off the assembly of the plurality of magnetic sensors 1 that have been formed integrally by performing the first through sixth steps into respective magnetic sensors 1. More specifically, the seventh step includes cutting off, by laser cutting or dicing, for example, the assembly of the plurality of magnetic sensors 1 that have been formed integrally into respective magnetic sensors 1.

An eighth step includes forming a plurality of end face electrodes 16 on each magnetic sensor 1 that has been cut off. More specifically, the eighth step includes forming a CuNi based alloy film on the outer peripheral surfaces 113 of the supporting substrate 11 by sputtering, for example, thereby forming a plurality of end face electrodes 16 on each of the plurality of magnetic sensors 1. This allows the plurality of upper surface electrodes 15 and the plurality of lower surface electrodes 17 to be connected together via the plurality of end face electrodes 16.

A ninth step includes forming plating layers 18 on each of the plurality of magnetic sensors 1. More specifically, the ninth step includes sequentially forming a Cu plating layer and an Sn plating layer as the plating layers 18 with respect to each of the plurality of magnetic sensors 1.

The magnetic sensor 1 according to the first embodiment may be manufactured by performing the first through ninth steps described above.

(4) Advantages

In the magnetic sensor 1 according to the first embodiment, one of the two resistance portions 1311, 1341 located at both ends in the first direction D1 connects together the first wiring portion 1351 and second wiring portion 1352 of the first wiring pattern portion 135 and the other resistance portion connects together the first wiring portion 1361 and second wiring portion 1362 of the second wiring pattern portion 136. This allows, when the detection target 2 moves in the first direction D1, the outer resistance portions 1311, 1341 that connect the upper and lower wiring patterns to have the same resistance value variation as the inner resistance portions 1321, 1331, 312, 1322, 1332, 1342. Consequently, this reduces the chances of causing a decline in the positioning accuracy of the detection target 2.

In addition, in the magnetic sensor 1 according to the first embodiment, each of the first wiring pattern portion 135 and the second wiring pattern portion 136 is made of the same material as the plurality of magnetoresistance pattern portions 131-134 as described above. This allows the first wiring pattern portion 135, the second wiring pattern portion 136, and the magnetoresistance pattern portions 131-134 to be formed in the same manufacturing process step, thus reducing an increase in the number of manufacturing process steps. That is why the magnetic sensor 1 according to the first embodiment may reduce the chances of causing a decline in the positioning accuracy of the detection target 2 while reducing an increase in the number of manufacturing process steps.

Furthermore, in the magnetic sensor 1 according to the first embodiment, the plurality of (e.g., four) magnetoresistance pattern portions 131-134 forms a full bridge circuit as described above.

Furthermore, in the magnetic sensor 1 according to the first embodiment, the inner resistance portions 1312, 1321, 1322, 1331, 1332, 1342 are formed in the same shape when viewed in the third direction D3 as described above. This allows the variations in the resistance value of the inner resistance portions 1312, 1321, 1322, 1331, 1332, 1342 to have the same behavior, thus reducing an error due to waveform distortion.

(5) Variations

Note that the first embodiment described above is only an exemplary one of various embodiments of the present disclosure and should not be construed as limiting. Rather, the first embodiment may be readily modified in various manners depending on a design choice or any other factor without departing from the scope of the present disclosure. Next, variations of the first embodiment will be enumerated one after another. Note that the variations to be described below may be adopted in combination as appropriate.

In the first embodiment described above, among the plurality of first resistance portions 1311, 1321, 1331, 1341 and the plurality of second resistance portions 1312, 1322, 1332, 1342, the inner resistance portions 1312, 1321, 1322, 1331, 1332, 1342 are formed in the same shape when viewed in the third direction D3. Alternatively, the plurality of first resistance portions 1311, 1321, 1331, 1341 and the plurality of second resistance portions 1312, 1322, 1332, 1342 may all be formed in the same shape when viewed in the third direction D3. In other words, at least the inner resistance portions 1312, 1321, 1322, 1331, 1332, 1342 among the plurality of first resistance portions 1311, 1321, 1331, 1341 and the plurality of second resistance portions 1312, 1322, 1332, 1342 need to be formed in the same shape when viewed in the third direction D3.

The plurality of first resistance portions 1311, 1321, 1331, 1341 and the plurality of second resistance portions 1312, 1322, 1332, 1342 do not have to have the meandering shape but may have any other shape.

In the first embodiment described above, each of the plurality of magnetoresistance pattern portions 131-134 consists of two resistance portions. Alternatively, each of the plurality of magnetoresistance pattern portions 131-134 may also consist of only one resistance portion or even three or more resistance portions.

Second Embodiment

Next, a magnetic sensor according to a second embodiment will be described with reference to FIGS. 6-8. In the following description, any constituent element of this second embodiment, having the same function as a counterpart of the magnetic sensor 1 according to the first embodiment described above, will be designated by the same reference numeral as that counterpart's, and description thereof will be omitted herein.

In the magnetic sensor according to the second embodiment, the respective outer edges 101, 102 of the plurality of first resistance portions 1311, 1321, 1331, 1341 each have an arc shape and the respective outer edges 201, 202 of the plurality of second resistance portions 1312, 1322, 1332, 1342 each have an arc shape, which is a difference from the magnetic sensor 1 according to the first embodiment.

(1) Overview

Patent Literature 2 discloses a magnetoresistive element (magnetic sensor) including a plurality of double meandering magneto-sensitive pattern units (magnetoresistance pattern portions).

Each of the plurality of double meandering magneto-sensitive pattern units includes a plurality of main magneto-sensitive portions and a plurality of sub-magneto-sensitive portions. In each of the plurality of double meandering magneto-sensitive pattern units, each of the main magneto-sensitive portions is formed in a first direction that is a direction in which a magnet (as a detection target) moves with respect to the magnetoresistive element. The plurality of main magneto-sensitive portions are arranged side by side in a second direction perpendicular to the first direction. Each of the plurality of sub-magneto-sensitive portions is formed in the second direction. The plurality of sub-magneto-sensitive portions alternately connects either respective first end portions or respective second end portions in the first direction of two adjacent main magneto-sensitive portions, out of the plurality of main magneto-sensitive portions.

In the magnetic sensor of Patent Literature 2, when the magnetoresistive element is oriented obliquely with respect to the moving direction of the magnet, for example, the positioning accuracy of the magnet will decrease, which is a problem with the magnetic sensor of Patent Literature 2. To overcome this problem, the magnetic sensor according to the second embodiment adopts the following configuration:

Specifically, a magnetic sensor according to the second embodiment is a magnetic sensor for detecting the position of a detection target 2 (refer to FIG. 3) based on a change in magnetic field strength to be caused by relative movement of the detection target 2 in the first direction D1. The magnetic sensor 1 includes a plurality of magnetoresistance pattern portions 131-134 as shown in FIG. 6. The plurality of magnetoresistance pattern portions 131-134 form a bridge circuit.

Figure 6:
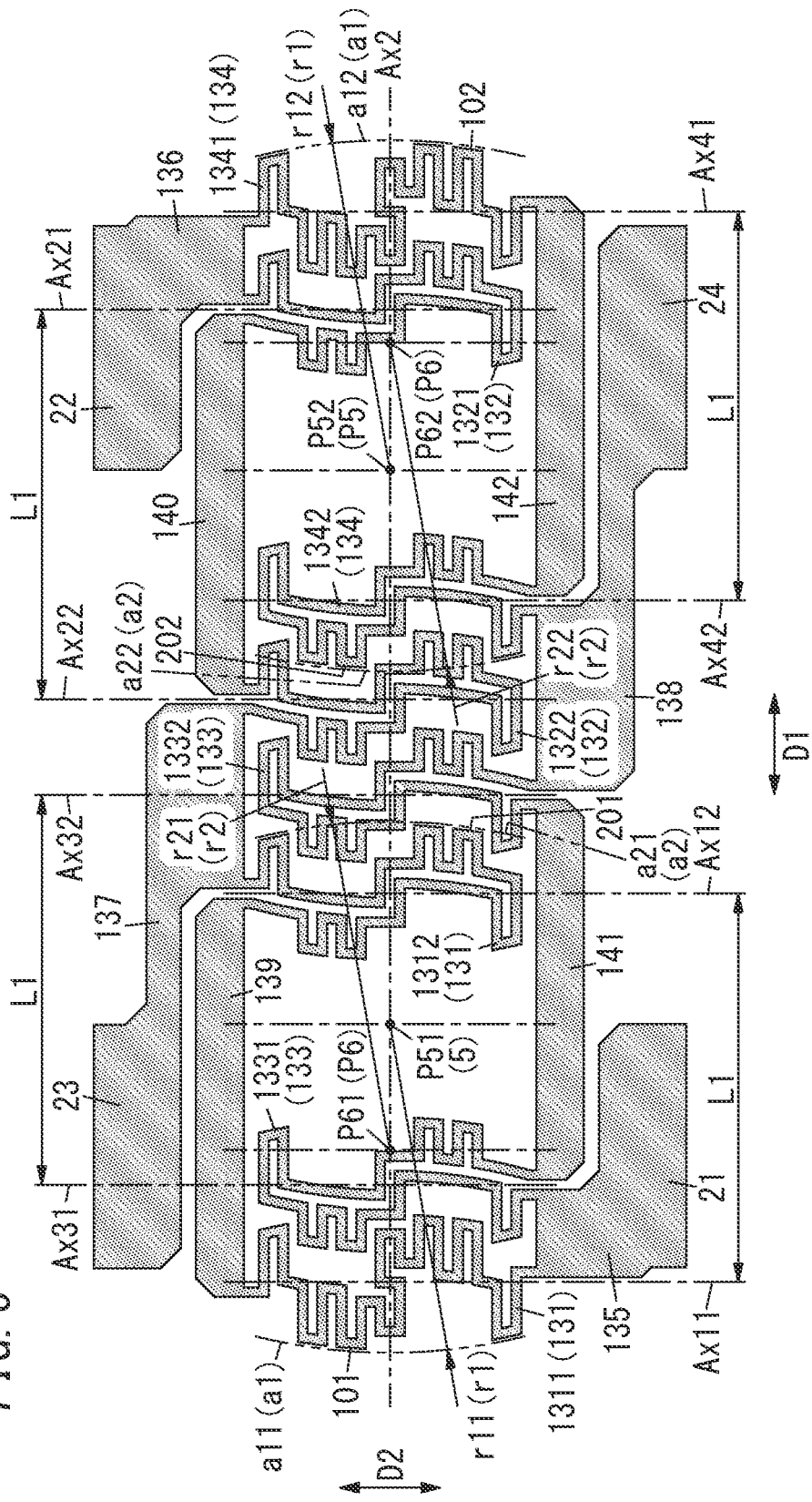
FIG. 6 illustrates an exemplary arrangement of magnetoresistance pattern portions, wiring pattern portions, and terminals in a magnetic sensor according to a second embodiment.

Each of the plurality of magnetoresistance pattern portions 131-134 includes a first resistance portion 1311, 1321, 1331, 1341 and a second resistance portion 1312, 1322, 1332, 1342 that are connected together in series as shown in FIG. 6. Each of the plurality of first resistance portions 1311, 1321, 1331, 1341 and the plurality of second resistance portions 1312, 1322, 1332, 1342 included in the plurality of magnetoresistance pattern portions 131-134 is formed in the second direction D2. The second direction D2 is a direction perpendicular to the first direction D1. The plurality of first resistance portions 1311, 1321, 1331, 1341 and the plurality of second resistance portions 1312, 1322, 1332, 1342 are arranged side by side in the first direction D1.

In each of the plurality of magnetoresistance pattern portions 131-134, an outer edge 101, 102 of the first resistance portion 1311-1341 in the first direction D1 is formed in the shape that extends along an arc a1, of which the center is defined by a point P5 on the centerline Ax2 of the first resistance portion 1311-1341 in the second direction D2 as shown in FIG. 6. Also, in each of the plurality of magnetoresistance pattern portions 131-134, an outer edge 201, 202 of the second resistance portion 1312-1342 in the first direction D1 is formed in the shape that extends along an arc a2, of which the center is defined by a point P6 on the centerline Ax2 of the second resistance portion 1312-1342 in the second direction D2 as shown in FIG. 6.

In the magnetic sensor according to the second embodiment, in each of the plurality of magnetoresistance pattern portions 131-134, an outer edge 101, 102 of the first resistance portion 1311-1341 in the first direction D1 is formed in the shape that extends along an arc a1, of which the center is defined by a point P5 on the centerline Ax2 of the first resistance portion 1311-1341 in the second direction D2 as described above. In addition, in the magnetic sensor according to the second embodiment, in each of the plurality of magnetoresistance pattern portions 131-134, an outer edge 201, 202 of the second resistance portion 1312-1342 in the first direction D1 is formed in the shape that extends along an arc a2, of which the center is defined by a point P6 on the centerline Ax2 of the second resistance portion 1312-1342 in the second direction D2. This enables eliminating corner portions that would most significantly affect the positional shift of the detection target 2. This would minimize the positional shift error even when the magnetic sensor is oriented obliquely with respect to the detection target 2. Consequently, this reduces the chances of causing a decline in the positioning accuracy of the detection target 2.

(2) Details

Next, the magnetic sensor according to the second embodiment will be described in further detail with reference to FIG. 6.

(2.1) Exemplary Arrangement of Magnetoresistance Pattern Portions, Wiring Pattern Portions, and Terminals Next, an exemplary arrangement of the plurality of magnetoresistance pattern portions 131-134, the first to fourth wiring pattern portions 135-138, and the four terminals 21-24 in the magnetic sensor according to the second embodiment will be described with reference to FIG. 6. In FIG. 6, the plurality of magnetoresistance pattern portions 131-134, the first to fourth wiring pattern portions 135-138, and the four terminals 21-24 are shaded by dot hatching to be easily distinguished. In addition, in FIG. 6, first to fourth connection pattern portions 139-142 (to be described later) are also shaded by dot hatching.

The magnetic sensor according to the second embodiment is different from the magnetic sensor 1 according to the first embodiment only in the respective outer edge shapes of the plurality of first resistance portions 1311, 1321, 1331, 1341 and the plurality of second resistance portions 1312, 1322, 1332, 1342. That is to say, in the magnetic sensor according to the second embodiment, the plurality of magnetoresistance pattern portions 131-134, the first to fourth wiring pattern portions 135-138, and the four terminals 21-24 are arranged in the same way as in the magnetic sensor 1 according to the first embodiment, and description thereof will be omitted herein.

In the magnetic sensor according to the second embodiment, the first resistance portion 1311 and second resistance portion 1312 of the first magnetoresistance pattern portion 131 are spaced in the first direction D1 by a distance L1, which is one half as long as the cycle of magnetization λ of the detection target 2 as shown in FIG. 6. The distance L1 is the distance between a centerline Ax11 of the first resistance portion 1311 in the first direction D1 and a centerline Ax12 of the second resistance portion 1312 in the first direction D1. That is to say, the distance L1 is the length of a line segment that connects together the center of the first resistance portion 1311 and the center of the second resistance portion 1312. In this case, the center of the first resistance portion 1311 is the intersection between the centerline Ax11 of the first resistance portion 1311 in the first direction D1 and a centerline Ax2 of the first resistance portion 1311 in the second direction D2. The center of the second resistance portion 1312 is the intersection between the centerline Ax12 of the second resistance portion 1312 in the first direction D1 and the centerline Ax2 of the second resistance portion 1312 in the second direction D2.

In the same way, the first resistance portion 1321 and second resistance portion 1322 of the second magnetoresistance pattern portion 132 are also spaced in the first direction D1 by the distance L1 that is one half as long as the cycle of magnetization λ of the detection target 2. The distance L1 is the distance between a centerline Ax21 of the first resistance portion 1321 in the first direction D1 and a centerline Ax22 of the second resistance portion 1322 in the first direction D1. That is to say, the distance L1 is the length of a line segment that connects together the center of the first resistance portion 1321 and the center of the second resistance portion 1322. In this case, the center of the first resistance portion 1321 is the intersection between the centerline Ax21 of the first resistance portion 1321 in the first direction D1 and the centerline Ax2 of the first resistance portion 1321 in the second direction D2. The center of the second resistance portion 1322 is the intersection between the centerline Ax22 of the second resistance portion 1322 in the first direction D1 and the centerline Ax2 of the second resistance portion 1322 in the second direction D2.

Furthermore, the first resistance portion 1331 and second resistance portion 1332 of the third magnetoresistance pattern portion 133 are also spaced in the first direction D1 by the distance L1 that is one half as long as the cycle of magnetization λ of the detection target 2. The distance L1 is the distance between a centerline Ax31 of the first resistance portion 1331 in the first direction D1 and a centerline Ax32 of the second resistance portion 1332 in the first direction D1. That is to say, the distance L1 is the length of a line segment that connects together the center of the first resistance portion 1331 and the center of the second resistance portion 1332. In this case, the center of the first resistance portion 1331 is the intersection between the centerline Ax31 of the first resistance portion 1331 in the first direction D1 and the centerline Ax2 of the first resistance portion 1331 in the second direction D2. The center of the second resistance portion 1332 is the intersection between the centerline Ax32 of the second resistance portion 1332 in the first direction D1 and the centerline Ax2 of the second resistance portion 1332 in the second direction D2.

Furthermore, the first resistance portion 1341 and second resistance portion 1342 of the fourth magnetoresistance pattern portion 134 are also spaced in the first direction D1 by the distance L1 that is one half as long as the cycle of magnetization λ of the detection target 2. The distance L1 is the distance between a centerline Ax41 of the first resistance portion 1341 in the first direction D1 and a centerline Ax42 of the second resistance portion 1342 in the first direction D1. That is to say, the distance L1 is the length of a line segment that connects together the center of the first resistance portion 1341 and the center of the second resistance portion 1342. In this case, the center of the first resistance portion 1341 is the intersection between the centerline Ax41 of the first resistance portion 1341 in the first direction D1 and the centerline Ax2 of the first resistance portion 1341 in the second direction D2. The center of the second resistance portion 1342 is the intersection between the centerline Ax42 of the second resistance portion 1342 in the first direction D1 and the centerline Ax2 of the second resistance portion 1342 in the second direction D2.

The first wiring pattern portion 135 connects together the first magnetoresistance pattern portion 131 and the power supply terminal 21 and also connects together the third magnetoresistance pattern portion 133 and the power supply terminal 21 as shown in FIG. 6. The first wiring pattern portion 135 is formed in the shape of a rectangular plate when viewed in plan in the third direction D3. The first wiring pattern portion 135 is connected to the power supply terminal 21 at a first end portion thereof. A second end portion of the first wiring pattern portion 135 is connected to a first end portion of the first resistance portion 1311 of the first magnetoresistance pattern portion 131 and a first end portion of the first resistance portion 1331 of the third magnetoresistance pattern portion 133. A second end portion of the first resistance portion 1311 of the first magnetoresistance pattern portion 131 is connected to a second end portion of the second resistance portion 1312 via a first connection pattern portion 139. A first end portion of the second resistance portion 1312 of the first magnetoresistance pattern portion 131 is connected to the third wiring pattern portion 137. A second end portion of the first resistance portion 1331 of the third magnetoresistance pattern portion 133 is connected to a second end portion of the second resistance portion 1332 via a third connection pattern portion 141. A first end portion of the second resistance portion 1332 of the third magnetoresistance pattern portion 133 is connected to the fourth wiring pattern portion 138.

The second wiring pattern portion 136 connects together the second magnetoresistance pattern portion 132 and the ground terminal 22 and also connects together the fourth magnetoresistance pattern portion 134 and the ground terminal 22 as shown in FIG. 6. The second wiring pattern portion 136 is formed in the shape of a rectangular plate when viewed in plan in the third direction D3. The second wiring pattern portion 136 is connected to the ground terminal 22 at a first end portion thereof. A second end portion of the second wiring pattern portion 136 is connected to a first end portion of the first resistance portion 1321 of the second magnetoresistance pattern portion 132 and a first end portion of the first resistance portion 1341 of the fourth magnetoresistance pattern portion 134. A second end portion of the first resistance portion 1321 of the second magnetoresistance pattern portion 132 is connected to a second end portion of the second resistance portion 1322 via a second connection pattern portion 140. A first end portion of the second resistance portion 1322 of the second magnetoresistance pattern portion 132 is connected to the third wiring pattern portion 137. A second end portion of the first resistance portion 1341 of the fourth magnetoresistance pattern portion 134 is connected to a second end portion of the second resistance portion 1342 via a fourth connection pattern portion 142. A first end portion of the second resistance portion 1342 of the fourth magnetoresistance pattern portion 134 is connected to the fourth wiring pattern portion 138.

The third wiring pattern portion 137 connects together the first magnetoresistance pattern portion 131 and the first output terminal 23 and also connects together the second magnetoresistance pattern portion 132 and the first output terminal 23 as shown in FIG. 6. The third wiring pattern portion 137 is formed in an L-shape when viewed in plan in the third direction D3 and connected to the first output terminal 23 at a first end portion thereof. The second end portion of the third wiring pattern portion 137 is connected to the first end portion of the second resistance portion 1312 of the first magnetoresistance pattern portion 131 and the first end portion of the second resistance portion 1322 of the second magnetoresistance pattern portion 132 as described above.

The fourth wiring pattern portion 138 connects together the third magnetoresistance pattern portion 133 and the second output terminal 24 and also connects together the fourth magnetoresistance pattern portion 134 and the second output terminal 24 as shown in FIG. 6. The fourth wiring pattern portion 138 is formed in an L-shape when viewed in plan in the third direction D3 and connected to the second output terminal 24 at a first end portion thereof. The second end portion of the fourth wiring pattern portion 138 is connected to the first end portion of the second resistance portion 1332 of the third magnetoresistance pattern portion 133 and the first end portion of the second resistance portion 1342 of the fourth magnetoresistance pattern portion 134 as described above.

(2.2) Shapes of Magnetoresistance Pattern Portions

Next, the respective shapes of the plurality of magnetoresistance pattern portions 131-134 will be described with reference to FIG. 6.

The first magnetoresistance pattern portion 131 includes the first resistance portion 1311 and the second resistance portion 1312 as described above. The second magnetoresistance pattern portion 132 includes the first resistance portion 1321 and the second resistance portion 1322 as described above. The third magnetoresistance pattern portion 133 includes the first resistance portion 1331 and the second resistance portion 1332 as described above. The fourth magnetoresistance pattern portion 134 includes the first resistance portion 1341 and the second resistance portion 1342 as described above. In the following description, only the first magnetoresistance pattern portion 131 and the fourth magnetoresistance pattern portion 134 will be described, out of the plurality of magnetoresistance pattern portions 131-134. The description of the second magnetoresistance pattern portion 132 and the third magnetoresistance pattern portion 133 will be omitted herein because the same statement applies to the second magnetoresistance pattern portion 132 and the third magnetoresistance pattern portion 133 as well.

The outer edge 101 (i.e., the left outer edge in FIG. 6) of the first resistance portion 1311 of the first magnetoresistance pattern portion 131 in the first direction D1 is formed in the shape that extends along an arc a11. The arc a11 is an arc, of which the center is defined by a point P51 on a centerline Ax2, and which has a radius r11. The centerline Ax2 is the centerline of the first resistance portion 1311 in the second direction D2. In this case, the radius r11 of the arc a11 is preferably equal to or greater than 30% and equal to or less than 70% of the cycle of magnetization $\lambda$ of the detection target 2.

The outer edge 202 (i.e., the right outer edge in FIG. 6) of the second resistance portion 1312 of the first magnetoresistance pattern portion 131 in the first direction D1 is formed in the shape that extends along an arc a21. The arc a21 is an arc, of which the center is defined by a point P61 on the centerline Ax2, and which has a radius r21. The centerline Ax2 is the centerline of the second resistance portion 1312 in the second direction D2. The radius r21 of the arc a21, as well as the radius r11 of the arc a11, is preferably equal to or greater than 30% and equal to or less than 70% of the cycle of magnetization $\lambda$ of the detection target 2. Also, the radius r21 of the arc a21 may be either the same as, or different from, the radius r11 of the arc a11, whichever is appropriate.

The outer edge 102 (i.e., the right outer edge in FIG. 6) of the first resistance portion 1341 of the fourth magnetoresistance pattern portion 134 in the first direction D1 is formed in the shape that extends along an arc a12. The arc a12 is an arc, of which the center is defined by a point P52 on the centerline Ax2 and which has a radius r12. The centerline Ax2 is the centerline of the first resistance portion 1341 in the second direction D2. The radius r12 of the arc a12, as well as the radius r11 of the arc a11, is preferably equal to or greater than 30% and equal to or less than 70% of the cycle of magnetization λ of the detection target 2. Also, the radius r12 of the arc a12 may be either the same as, or different from, the radius r11 of the arc a11, whichever is appropriate. Furthermore, the radius r12 of the arc a12 may be either the same as, or different from, the radius r21 of the arc a21, whichever is appropriate.

The outer edge 202 (i.e., the left outer edge in FIG. 6) of the second resistance portion 1342 of the fourth magnetoresistance pattern portion 134 in the first direction D1 is formed in the shape that extends along an arc a22. The arc a22 is an arc, of which the center is defined by a point P62 on the centerline Ax2 and which has a radius r22. The centerline Ax2 is the centerline of the second resistance portion 1342 in the second direction D2. The radius r22 of the arc a22, as well as the radius r11 of the arc a11, is preferably equal to or greater than 30% and equal to or less than 70% of the cycle of magnetization λ of the detection target 2. Also, the radius r22 of the arc a22 may be either the same as, or different from, the radius r11 of the arc a11, whichever is appropriate. Furthermore, the radius r22 of the arc a22 may be either the same as, or different from, the radius r21 of the arc a21, whichever is appropriate. Furthermore, the radius r22 of the arc a22 may be either the same as, or different from, the radius r12 of the arc a12, whichever is appropriate.

Likewise, the opposite outer edge (i.e., the right outer edge in FIG. 6) of the first resistance portion 1311 of the first magnetoresistance pattern portion 131 in the first direction D1 also preferably has a shape extending along an arc, of which the radius is equal to or greater than 30% and equal to or less than 70% of the cycle of magnetization λ of the detection target 2. The same statement applies to the opposite outer edge (i.e., the left outer edge in FIG. 6) of the second resistance portion 1312 of the first magnetoresistance pattern portion 131 in the first direction D1, the opposite outer edge (i.e., the left outer edge in FIG. 6) of the first resistance portion 1341 of the fourth magnetoresistance pattern portion 134 in the first direction D1, and the opposite outer edge (i.e., the right outer edge in FIG. 6) of the second resistance portion 1342 of the fourth magnetoresistance pattern portion 134 in the first direction D1.

Furthermore, in the magnetic sensor according to the second embodiment, a plurality of (e.g., three) protruding portions, each protruding in the first direction D1 from the first resistance portion 1311 of the first magnetoresistance pattern portion 131, are arranged side by side in the second direction D2 as shown in FIG. 6. The outer edge 101 is formed by the respective outer edges of these protruding portions. In addition, in the magnetic sensor according to the second embodiment, two protruding portions, out of the plurality of protruding portions, are located on one side (i.e., the upper side in FIG. 6) in the second direction D2 and the other protruding portion is located on the other side (i.e., the lower side in FIG. 6) in the second direction D2.

Furthermore, in the magnetic sensor according to the second embodiment, a plurality of (e.g., three) protruding portions, each protruding in the first direction D1 from the second resistance portion 1312 of the first magnetoresistance pattern portion 131, are arranged side by side in the second direction D2 as shown in FIG. 6. The outer edge 201 is formed by the respective outer edges of these protruding portions. In addition, in the magnetic sensor according to the second embodiment, two protruding portions, out of the plurality of protruding portions, are located on one side (i.e., the lower side in FIG. 6) in the second direction D2 and the other protruding portion is located on the other side (i.e., the upper side in FIG. 6) in the second direction D2.

Furthermore, in the magnetic sensor according to the second embodiment, a plurality of (e.g., three) protruding portions, each protruding in the first direction D1 from the first resistance portion 1341 of the fourth magnetoresistance pattern portion 134, are arranged side by side in the second direction D2 as shown in FIG. 6. The outer edge 102 is formed by the respective outer edges of these protruding portions. In addition, in the magnetic sensor according to the second embodiment, two protruding portions, out of the plurality of protruding portions, are located on one side (i.e., the lower side in FIG. 6) in the second direction D2 and the other protruding portion is located on the other side (i.e., the upper side in FIG. 6) in the second direction D2.

Furthermore, in the magnetic sensor according to the second embodiment, a plurality of (e.g., three) protruding portions, each protruding in the first direction D1 from the second resistance portion 1342 of the fourth magnetoresistance pattern portion 134, are arranged side by side in the second direction D2 as shown in FIG. 6. The outer edge 202 is formed by the respective outer edges of these protruding portions. In addition, in the magnetic sensor according to the second embodiment, two protruding portions, out of the plurality of protruding portions, are located on one side (i.e., the upper side in FIG. 6) in the second direction D2 and the other protruding portion is located on the other side (i.e., the lower side in FIG. 6) in the second direction D2.

(3) Advantages

In the magnetic sensor according to the second embodiment, in each of the plurality of magnetoresistance pattern portions 131-134, the outer edge 101, 102 of the first resistance portion 1311-1341 in the first direction D1 is formed in the shape that extends along an arc a1, of which the center is defined by the point P5 on the centerline Ax2 of the first resistance portion 1311-1341 in the second direction D2. In addition, in the magnetic sensor according to the second embodiment, in each of the plurality of magnetoresistance pattern portions 131-134, the outer edge 201, 202 of the second resistance portion 1312-1342 in the first direction D1 is formed in the shape that extends along an arc a2, of which the center is defined by the point P6 on the centerline Ax2 of the second resistance portion 1312-1342 in the second direction D2. This enables eliminating corner portions that would most significantly affect the positional shift of the detection target 2. This would minimize the positional shift error even when the magnetic sensor is oriented obliquely with respect to the detection target 2. Consequently, this reduces the chances of causing a decline in the positioning accuracy of the detection target 2.

In addition, in the magnetic sensor according to the second embodiment, in each of the plurality of magnetoresistance pattern portions 131-134, the first resistance portion 1311, 1321, 1331, 1341 and the second resistance portion 1312, 1322, 1332, 1342 are spaced from each other in the first direction D1 by a distance L1 which is one half as long as the cycle of magnetization λ. This enables making the direction of the magnetic force applied to the first resistance portion 1311, 1321, 1331, 1341 opposite from the direction of the magnetic force applied to the second resistance portion 1312, 1322, 1332, 1342.

Furthermore, in the magnetic sensor according to the second embodiment, each of the plurality of first resistance portions 1311, 1321, 1331, 1341 and the plurality of second resistance portions 1312, 1322, 1332, 1342 is formed in a meandering shape when viewed in plan in the third direction D3. This allows each of the plurality of first resistance portions 1311, 1321, 1331, 1341 and the plurality of second resistance portions 1312, 1322, 1332, 1342 to have an equal length, Furthermore, in the magnetic sensor according to the second embodiment, the inner resistance portions 1312, 1321, 1322, 1331, 1332, 1342 are formed in the same shape when viewed in plan in the third direction D3. This allows the variations in the resistance value of the inner resistance portions 1312, 1321, 1322, 1331, 1332, 1342 to have the same behavior.

(4) Variations

Note that the second embodiment described above is only an exemplary one of various embodiments of the present disclosure and should not be construed as limiting. Rather, the second embodiment may be readily modified in various manners depending on a design choice or any other factor without departing from the scope of the present disclosure. Next, variations of the second embodiment will be enumerated one after another. Note that the variations to be described below may be adopted in combination as appropriate.

(4.1) First Variation

A magnetic sensor according to a first variation of the second embodiment will be described with reference to FIG. 7.

In a magnetic sensor according to the first variation, each of the plurality of first resistance portions 1311, 1321, 1331, 1341 and the plurality of second resistance portions 1312, 1322, 1332, 1342 of the plurality of magnetoresistance pattern portions 131-134 has a different shape from their counterpart of the magnetic sensor according to the second embodiment, which is a difference from the magnetic sensor according to the second embodiment. The plurality of first resistance portions 1311, 1321, 1331, 1341 and the plurality of second resistance portions 1312, 1322, 1332, 1342 are connected in the same way as in the magnetic sensor according to the second embodiment and detailed description thereof will be omitted herein.

Figure 7:
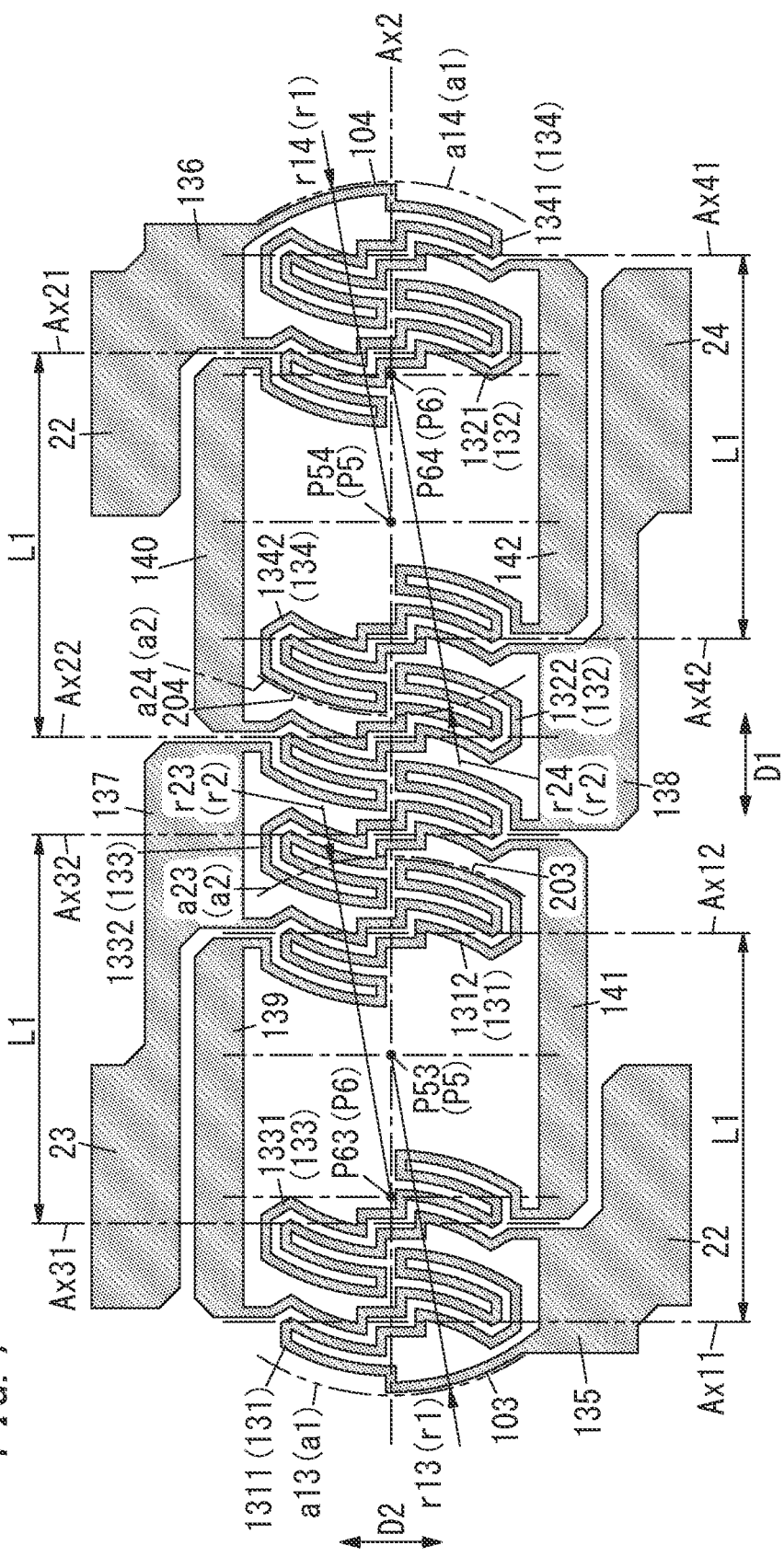
FIG. 7 illustrates an exemplary arrangement of magnetoresistance pattern portions, wiring pattern portions, and terminals in a magnetic sensor according to a first variation of the second embodiment.

In the magnetic sensor according to the first variation, the first resistance portion 1311 of the first magnetoresistance pattern portion 131, the first resistance portion 1331 of the third magnetoresistance pattern portion 133, the second resistance portion 1312 of the first magnetoresistance pattern portion 131, the second resistance portion 1332 of the third magnetoresistance pattern portion 133, the second resistance portion 1322 of the second magnetoresistance pattern portion 132, the second resistance portion 1342 of the fourth magnetoresistance pattern portion 134, the first resistance portion 1321 of the second magnetoresistance pattern portion 132, and the first resistance portion 1341 of the fourth magnetoresistance pattern portion 134 are arranged side by side in the first direction D1 in this order from left to right as shown in FIG. 7.

The outer edge 103 (i.e., the left outer edge in FIG. 7) of the first resistance portion 1311 of the first magnetoresistance pattern portion 131 in the first direction D1 is formed in the shape that extends along an arc a13. The arc a13 is an arc, of which the center is defined by a point P53 on the centerline Ax2 and which has a radius r13. The centerline Ax2 is the centerline of the first resistance portion 1311 in the second direction D2. In this case, the radius r13 of the arc a13 is preferably equal to or greater than 30% and equal to or less than 70% of the cycle of magnetization k of the detection target 2.

The outer edge 203 (i.e., the right outer edge in FIG. 7) of the second resistance portion 1312 of the first magnetoresistance pattern portion 131 in the first direction D1 is formed in the shape that extends along an arc a23. The arc a23 is an arc, of which the center is defined by a point P63 on the centerline Ax2, and which has a radius r23. The centerline Ax2 is the centerline of the second resistance portion 1312 in the second direction D2. The radius r23 of the arc a23, as well as the radius r13 of the arc a13, is preferably equal to or greater than 30% and equal to or less than 70% of the cycle of magnetization λ of the detection target 2. Also, the radius r23 of the arc a23 may be either the same as, or different from, the radius r13 of the arc a13, whichever is appropriate.

The outer edge 104 (i.e., the right outer edge in FIG. 7) of the first resistance portion 1341 of the fourth magnetoresistance pattern portion 134 in the first direction D1 is formed in the shape that extends along an arc a14. The arc a14 is an arc, of which the center is defined by a point P54 on the centerline Ax2 and which has a radius r14. The centerline Ax2 is the centerline of the first resistance portion 1341 in the second direction D2. The radius r14 of the arc a14, as well as the radius r13 of the arc a13, is preferably equal to or greater than 30% and equal to or less than 70% of the cycle of magnetization λ of the detection target 2. Also, the radius r14 of the arc a14 may be either the same as, or different from, the radius r13 of the arc a13, whichever is appropriate. Furthermore, the radius r14 of the arc a14 may be either the same as, or different from, the radius r23 of the arc a23, whichever is appropriate.

The outer edge 204 (i.e., the left outer edge in FIG. 7) of the second resistance portion 1342 of the fourth magnetoresistance pattern portion 134 in the first direction D1 is formed in the shape that extends along an arc a24. The arc a24 is an arc, of which the center is defined by a point P64 on the centerline Ax2 and which has a radius r24. The centerline Ax2 is the centerline of the second resistance portion 1342 in the second direction D2. The radius r24 of the arc a24, as well as the radius r13 of the arc a13, is preferably equal to or greater than 30% and equal to or less than 70% of the cycle of magnetization λ of the detection target 2. Also, the radius r24 of the arc a24 may be either the same as, or different from, the radius r13 of the arc a13, whichever is appropriate. Furthermore, the radius r24 of the arc a24 may be either the same as, or different from, the radius r23 of the arc a23, whichever is appropriate. Furthermore, the radius r24 of the arc a24 may be either the same as, or different from, the radius r14 of the arc a14, whichever is appropriate.

Likewise, the opposite outer edge (i.e., the right outer edge in FIG. 7) of the first resistance portion 1311 of the first magnetoresistance pattern portion 131 in the first direction D1 also preferably has a shape extending along an arc, of which the radius is equal to or greater than 30% and equal to or less than 70% of the cycle of magnetization λ of the detection target 2. The same statement applies to the opposite outer edge (i.e., the left outer edge in FIG. 7) of the second resistance portion 1312 of the first magnetoresistance pattern portion 131 in the first direction D1, the opposite outer edge (i.e., the left outer edge in FIG. 7) of the first resistance portion 1341 of the fourth magnetoresistance pattern portion 134 in the first direction D1, and the opposite outer edge (i.e., the right outer edge in FIG. 7) of the second resistance portion 1342 of the fourth magnetoresistance pattern portion 134 in the first direction D1.

Furthermore, in the magnetic sensor according to the first variation, the outer edge 103 is defined to be the outer edge of a single protruding portion protruding in the first direction D1 from the first resistance portion 1311 of the first magnetoresistance pattern portion 131 as shown in FIG. 7. Likewise, as for each of the second resistance portion 1312 of the first magnetoresistance pattern portion 131, the first resistance portion 1341 of the fourth magnetoresistance pattern portion 134, and the second resistance portion 1342 of the fourth magnetoresistance pattern portion 134, the outer edge 203, 104, 204 is defined to be the outer edge of a single protruding portion protruding in the first direction D1 therefrom.

The magnetic sensor according to the first variation, as well as the magnetic sensor according to the second embodiment, may reduce the chances of causing a decline in the positioning accuracy of the detection target 2.

(4.2) Second Variation

A magnetic sensor according to a second variation of the second embodiment will be described with reference to FIG. 8.

In a magnetic sensor according to the second variation, each of the plurality of first resistance portions 1311, 1321, 1331, 1341 and the plurality of second resistance portions 1312, 1322, 1332, 1342 of the plurality of magnetoresistance pattern portions 131-134 has a different shape from their counterpart of the magnetic sensor according to the second embodiment, which is a difference from the magnetic sensor according to the second embodiment. The plurality of first resistance portions 1311, 1321, 1331, 1341 and the plurality of second resistance portions 1312, 1322, 1332, 1342 are connected in the same way as in the magnetic sensor according to the second embodiment and detailed description thereof will be omitted herein.

Figure 8:
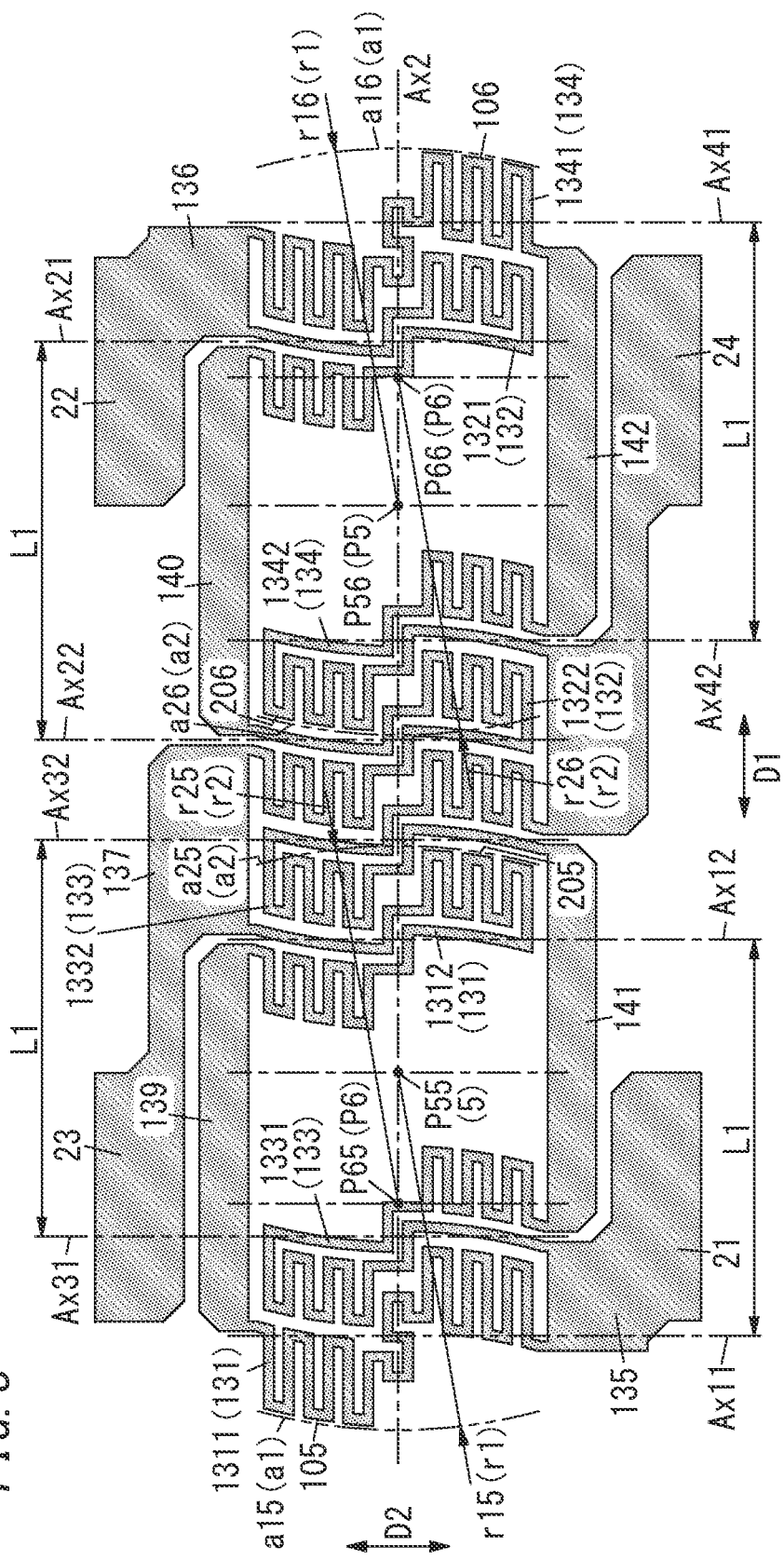
FIG. 8 illustrates an exemplary arrangement of magnetoresistance pattern portions, wiring pattern portions, and terminals in a magnetic sensor according to a second variation of the second embodiment.

In the magnetic sensor according to the second variation, the first resistance portion 1311 of the first magnetoresistance pattern portion 131, the first resistance portion 1331 of the third magnetoresistance pattern portion 133, the second resistance portion 1312 of the first magnetoresistance pattern portion 131, the second resistance portion 1332 of the third magnetoresistance pattern portion 133, the second resistance portion 1322 of the second magnetoresistance pattern portion 132, the second resistance portion 1342 of the fourth magnetoresistance pattern portion 134, the first resistance portion 1321 of the second magnetoresistance pattern portion 132, and the first resistance portion 1341 of the fourth magnetoresistance pattern portion 134 are arranged side by side in the first direction D1 in this order from left to right as shown in FIG. 8.

The outer edge 105 (i.e., the left outer edge in FIG. 8) of the first resistance portion 1311 of the first magnetoresistance pattern portion 131 in the first direction D1 is formed in the shape that extends along an arc a15. The arc a15 is an arc, of which the center is defined by a point P55 on the centerline Ax2, and which has a radius r15. The centerline Ax2 is the centerline of the first resistance portion 1311 in the second direction D2. In this case, the radius r15 of the arc a15 is preferably equal to or greater than 30% and equal to or less than 70% of the cycle of magnetization λ of the detection target 2.

The outer edge 205 (i.e., the right outer edge in FIG. 8) of the second resistance portion 1312 of the first magnetoresistance pattern portion 131 in the first direction D1 is formed in the shape that extends along an arc a25. The arc a25 is an arc, of which the center is defined by a point P65 on the centerline Ax2 and which has a radius r25. The centerline Ax2 is the centerline of the second resistance portion 1312 in the second direction D2. In this case, the radius r25 of the arc a25, as well as the radius r15 of the arc a15, is preferably equal to or greater than 30% and equal to or less than 70% of the cycle of magnetization λ of the detection target 2. Also, the radius r25 of the arc a25 may be either the same as, or different from, the radius r15 of the arc a15, whichever is appropriate.

The outer edge 106 (i.e., the right outer edge in FIG. 8) of the first resistance portion 1341 of the fourth magnetoresistance pattern portion 134 in the first direction D1 is formed in the shape that extends along an arc a16. The arc a16 is an arc, of which the center is defined by a point P56 on the centerline Ax2 and which has a radius r16. The centerline Ax2 is the centerline of the first resistance portion 1341 in the second direction D2. In this case, the radius r16 of the arc a16, as well as the radius r15 of the arc a15, is preferably equal to or greater than 30% and equal to or less than 70% of the cycle of magnetization λ of the detection target 2. Also, the radius r16 of the arc a16 may be either the same as, or different from, the radius r15 of the arc a15, whichever is appropriate. Furthermore, the radius r16 of the arc a16 may be either the same as, or different from, the radius r25 of the arc a25, whichever is appropriate.

The outer edge 206 (i.e., the left outer edge in FIG. 8) of the second resistance portion 1342 of the fourth magnetoresistance pattern portion 134 in the first direction D1 is formed in the shape that extends along an arc a26. The arc a26 is an arc, of which the center is defined by a point P66 on the centerline Ax2 and which has a radius r26. The centerline Ax2 is the centerline of the second resistance portion 1342 in the second direction D2. The radius r26 of the arc a26, as well as the radius r15 of the arc a15, is preferably equal to or greater than 30% and equal to or less than 70% of the cycle of magnetization λ of the detection target 2. Also, the radius r26 of the arc a26 may be either the same as, or different from, the radius r15 of the arc a15, whichever is appropriate. Furthermore, the radius r26 of the arc a26 may be either the same as, or different from, the radius r25 of the arc a25, whichever is appropriate. Furthermore, the radius r26 of the arc a26 may be either the same as, or different from, the radius r16 of the arc a16, whichever is appropriate.

Likewise, the opposite outer edge (i.e., the right outer edge in FIG. 8) of the first resistance portion 1311 of the first magnetoresistance pattern portion 131 in the first direction D1 also preferably has a shape extending along an arc, of which the radius is equal to or greater than 30% and equal to or less than 70% of the cycle of magnetization λ of the detection target 2. The same statement applies to the opposite outer edge (i.e., the left outer edge in FIG. 8) of the second resistance portion 1312 of the first magnetoresistance pattern portion 131 in the first direction D1, the opposite outer edge (i.e., the left outer edge in FIG. 8) of the first resistance portion 1341 of the fourth magnetoresistance pattern portion 134 in the first direction D1, and the opposite outer edge (i.e., the right outer edge in FIG. 8) of the second resistance portion 1342 of the fourth magnetoresistance pattern portion 134 in the first direction D1.

Furthermore, in the magnetic sensor according to the second variation, a plurality of (e.g., three) protruding portions, each protruding in the first direction D1 from the first resistance portion 1311 of the first magnetoresistance pattern portion 131, are arranged side by side in the second direction D2 as shown in FIG. 8. The outer edge 105 is formed by the respective outer edges of these protruding portions. Likewise, as for each of the second resistance portion 1312 of the first magnetoresistance pattern portion 131, the first resistance portion 1341 of the fourth magnetoresistance pattern portion 134, and the second resistance portion 1342 of the fourth magnetoresistance pattern portion 134, a plurality of (e.g., three) protruding portions, each protruding in the first direction D1 therefrom, are arranged side by side in the second direction D2. The outer edge 205, 106, 206 is formed by the respective outer edges of these protruding portions.

The magnetic sensor according to the second variation, as well as the magnetic sensor according to the second embodiment, may reduce the chances of causing a decline in the positioning accuracy of the detection target 2.

(Aspects)

The embodiments and their variations described above are specific implementations of the following aspects of the present disclosure.

A magnetic sensor (1) according to a first aspect detects a position of a detection target (2) based on a change in magnetic field strength to be caused by relative movement of the detection target (2) in a first direction (D1). The magnetic sensor (1) includes a plurality of magnetoresistance pattern portions (131, 132, 133, 134), a first wiring pattern portion (135), and a second wiring pattern portion (136). The plurality of magnetoresistance pattern portions (131, 132, 133, 134) are arranged to form a bridge circuit. The first wiring pattern portion (135) is connected to a power supply terminal (21). The second wiring pattern portion (136) is connected to a ground terminal (22). Each of the first wiring pattern portion (135) and the second wiring pattern portion (136) is made of the same material as the plurality of magnetoresistance pattern portions (131, 132, 133, 134). The plurality of magnetoresistance pattern portions (131, 132, 133, 134) are arranged in the first direction (D1). Each of the plurality of magnetoresistance pattern portions (131, 132, 133, 134) includes a first resistance portion (1311, 1321, 1331, 1341) and a second resistance portion (1312, 1322, 1332, 1342) that are connected together in series. Each of the plurality of the first resistance portions (1311, 1321, 1331, 1341) and the plurality of the second resistance portions (1312, 1322, 1332, 1342) included in the plurality of magnetoresistance pattern portions (131, 132, 133, 134) is formed in a second direction (D2) perpendicular to the first direction (D1). Each of the first wiring pattern portion (135) and the second wiring pattern portion (136) includes a first wiring portion (1351, 1361) and a second wiring portion (1352, 1362) arranged on both sides of the plurality of magnetoresistance pattern portions (131, 132, 133, 134) in the second direction (D2). One of two resistance portions (1311, 1341) connects together the first wiring portion (1351) and the second wiring portion (1352) of the first wiring pattern portion (135). The other of the two resistance portions (1311, 1341) connects together the first wiring portion (1361) and the second wiring portion (1362) of the second wiring pattern portion (136). The two resistance portions (1311, 1341) are included in the plurality of the first resistance portions (1311, 1321, 1331, 1341) and the plurality of the second resistance portions (1312, 1322, 1332, 1342) and located at both ends in the first direction (D1).

This aspect reduces the chances of causing a decline in the positioning accuracy of the detection target (2) while reducing an increase in the number of manufacturing process steps.

In a magnetic sensor (1) according to a second aspect, which may be implemented in conjunction with the first aspect, the plurality of the first resistance portions (1311, 1321, 1331, 1341) and the plurality of the second resistance portions (1312, 1322, 1332, 1342) are arranged side by side in the first direction (D1). In each of the plurality of magnetoresistance pattern portions (131, 132, 133, 134), an outer edge (101-106) of the first resistance portion (1311, 1321, 1331, 1341) in the first direction (D1) is formed in a shape that extends along an arc (a1), of which a center is defined by a point (P5) on a centerline (Ax2) of the first resistance portion (1311, 1321, 1331, 1341) in the second direction (D2). An outer edge (201-206) of the second resistance portion (1312, 1322, 1332, 1342) in the first direction (D1) is formed in a shape that extends along an arc (a2), of which a center is defined by a point (P6) on a centerline (Ax2) of the second resistance portion (1312, 1322, 1332, 1342) in the second direction (D2).

This aspect reduces the chances of causing a decline in the positioning accuracy of the detection target (2).

In a magnetic sensor (1) according to a third aspect, which may be implemented in conjunction with the second aspect, the detection target (2) is magnetized in the first direction (D1) in a predetermined cycle of magnetization (λ). In each of the plurality of magnetoresistance pattern portions (131, 132, 133, 134), a radius (r1) of the arc (a1) of the first resistance portion (1311, 1321, 1331, 1341) and a radius (r2) of the arc (a2) of the second resistance portion (1312, 1322, 1332, 1342) are each equal to or less than 70% of the cycle of magnetization (λ).

This aspect reduces the chances of causing a decline in the positioning accuracy of the detection target (2).

In a magnetic sensor (1) according to a fourth aspect, which may be implemented in conjunction with the third aspect, each of the radii (r1, r2) is equal to or greater than 30% of the cycle of magnetization (λ).

In a magnetic sensor (1) according to a fifth aspect, which may be implemented in conjunction with the third or fourth aspect, in each of the plurality of magnetoresistance pattern portions (131, 132, 133, 134), the first resistance portion (1311, 1321, 1331, 1341) and the second resistance portion (1312, 1322, 1332, 1342) are spaced from each other in the first direction (D1) by a distance (L1) that is one half as long as the cycle of magnetization (λ).

This aspect may make the direction of magnetic force applied to the first resistance portion (1311, 1321, 1331, 1341) and the direction of the magnetic force applied to the second resistance portion (1312, 1322, 1332, 1342) opposite from each other.

In a magnetic sensor (1) according to a sixth aspect, which may be implemented in conjunction with any one of the first to fifth aspects, each of the plurality of the first resistance portions (1311, 1321, 1331, 1341) and the plurality of the second resistance portions (1312, 1322, 1332, 1342) is formed in a meandering shape when viewed in a third direction (D3). The third direction (D3) is perpendicular to both the first direction (D1) and the second direction (D2).

This aspect allows the respective resistance portions (1311, 1312, 1321, 1322, 1331, 1332, 1341, 1342) to have an equal length.

In a magnetic sensor (1) according to a seventh aspect, which may be implemented in conjunction with any one of the first to sixth aspects, at least respective inner resistance portions (1312, 1321, 1322, 1331, 1332, 1342) out of the plurality of the first resistance portions (1311, 1321, 1331, 1341) and the plurality of the second resistance portions (1312, 1322, 1332, 1342) are formed in the same shape when viewed in a third direction (D3). The third direction (D3) is perpendicular to both the first direction (D1) and the second direction (D2).

This aspect allows the variations in resistance value of the inner resistance portions (1312, 1321, 1322, 1331, 1332, 1342) to have the same behavior, thus reducing an error due to waveform distortion.

A magnetic sensor (1) according to an eighth aspect, which may be implemented in conjunction with any one of the first to seventh aspects, includes four magnetoresistance pattern portions (131, 132, 133, 134) as the plurality of magnetoresistance pattern portions (131, 132, 133, 134). The bridge circuit is a full bridge circuit formed by the four magnetoresistance pattern portions (131, 132, 133, 134).

A magnetic sensor (1) according to a ninth aspect, which may be implemented in conjunction with the eighth aspect, further includes a third wiring pattern portion (137) and a fourth wiring pattern portion (138). The third wiring pattern portion (137) is connected to a first output terminal (23). The fourth wiring pattern portion (138) is connected to a second output terminal (24). The third wiring pattern portion (137) is connected to a connection node (P1) between two magnetoresistance pattern portions (131, 132), which are connected together in series, out of the four magnetoresistance pattern portions (131, 132, 133, 134). The fourth wiring pattern portion (138) is connected to a connection node (P2) between remaining two magnetoresistance pattern portions (133, 134), other than the two magnetoresistance pattern portions (131, 132), out of the four magnetoresistance pattern portions (131, 132, 133, 134).

A magnetic sensor (1) according to a tenth aspect, which may be implemented in conjunction with the eighth aspect, further includes a third wiring pattern portion (137) and a fourth wiring pattern portion (138). The third wiring pattern portion (137) is connected to a first output terminal (23). The fourth wiring pattern portion (138) is connected to a second output terminal (24). The four magnetoresistance pattern portions (131, 132, 133, 134) consist of: a first magnetoresistance pattern portion (131) and a second magnetoresistance pattern portion (132) which are connected together in series; and a third magnetoresistance pattern portion (133) and a fourth magnetoresistance pattern portion (134) which are connected together in series. The first wiring pattern portion (135) is connected to one end portion, located opposite from the other end portion adjacent to the second magnetoresistance pattern portion (132), of the first magnetoresistance pattern portion (131) and one end portion, located opposite from the other end portion adjacent to the fourth magnetoresistance pattern portion (134), of the third magnetoresistance pattern portion (133). The second wiring pattern portion (136) is connected to one end portion, located opposite from the other end portion adjacent to the first magnetoresistance pattern portion (131), of the second magnetoresistance pattern portion (132) and one end portion, located opposite from the other end portion adjacent to the third magnetoresistance pattern portion (133), of the fourth magnetoresistance pattern portion (134). The third wiring pattern portion (137) is connected to the first magnetoresistance pattern portion (131) and the second magnetoresistance pattern portion (132). The fourth wiring pattern portion (138) is connected to the third magnetoresistance pattern portion (133) and the fourth magnetoresistance pattern portion (134).

A magnetic sensor (1) according to an eleventh aspect detects a position of a detection target (2) based on a change in magnetic field strength to be caused by relative movement of the detection target (2) in a first direction (D1). The magnetic sensor (1) includes a plurality of magnetoresistance pattern portions (131, 132, 133, 134). Each of the plurality of magnetoresistance pattern portions (131, 132, 133, 134) includes a first resistance portion (1311, 1321, 1331, 1341) and a second resistance portion (1312, 1322, 1332, 1342) that are connected together in series. Each of the plurality of the first resistance portions (1311, 1321, 1331, 1341) and the plurality of the second resistance portions (1312, 1322, 1332, 1342) included in the plurality of magnetoresistance pattern portions (131, 132, 133, 134) is formed in a second direction (D2) perpendicular to the first direction (D1). The plurality of first resistance portions (1311, 1321, 1331, 1341) and the plurality of the second resistance portions (1312, 1322, 1332, 1342) are arranged side by side in the first direction (D1). In each of the plurality of magnetoresistance pattern portions (131, 132, 133, 134), an outer edge (101-106) of the first resistance portion (1311, 1321, 1331, 1341) in the first direction (D1) is formed in a shape that extends along an arc (a1), of which a center is defined by a point (P5) on a centerline (Ax2) of the first resistance portion (1311, 1321, 1331, 1341) in the second direction (D2). Also, in each of the plurality of magnetoresistance pattern portions (131, 132, 133, 134), an outer edge (201-206) of the second resistance portion (1312, 1322, 1332, 1342) in the first direction (D1) is formed in a shape that extends along an arc (a2), of which a center is defined by a point (P6) on a centerline (Ax2) of the second resistance portion (1312, 1322, 1332, 1342) in the second direction (D2).

This aspect reduces the chances of causing a decline in the positioning accuracy of the detection target (2).

Note that the constituent elements according to the second to tenth aspects are not essential constituent elements for the magnetic sensor (1) but may be omitted as appropriate.

REFERENCE SIGNS LIST

1 Magnetic Sensor
2 Detection Target
21 Power Supply Terminal
22 Ground Terminal
23 First Output Terminal
24 Second Output Terminal
101-106 Outer Edge of First Resistance Portion
201-206 Outer Edge of Second Resistance Portion
131 First Magnetoresistance Pattern Portion (Magnetoresistance Pattern Portion)
132 Second Magnetoresistance Pattern Portion (Magnetoresistance Pattern Portion)
133 Third Magnetoresistance Pattern Portion (Magnetoresistance Pattern Portion)
134 Fourth Magnetoresistance Pattern Portion (Magnetoresistance Pattern Portion)
135 First Wiring Pattern Portion
136 Second Wiring Pattern Portion
137 Third Wiring Pattern Portion
138 Fourth Wiring Pattern Portion
1311, 1321, 1331, 1341 First Resistance Portion
1312, 1322, 1332, 1342 Second Resistance Portion
1351, 1361 First Wiring Portion
1352, 1362 Second Wiring Portion
a1, a11-a16 Arc
a2, a21-a26 Arc
Ax2 Centerline
D1 First Direction
D2 Second Direction
D3 Third Direction
P1, P2 Connection Node
L1 Distance
P5, P51-P56 Point
P6, P61-P66 Point
r1, r11-r16 Radius
r2, r21-r26 Radius
λ Cycle of Magnetization

The invention claimed is:

1. A magnetic sensor configured to detect a position of a detection target based on a change in magnetic field strength to be caused by relative movement of the detection target in a first direction, the magnetic sensor comprising:
   a plurality of magnetoresistance pattern portions arranged to form a bridge circuit;
   a first wiring pattern portion connected to a power supply terminal; and
   a second wiring pattern portion connected to a ground terminal,
   each of the first wiring pattern portion and the second wiring pattern portion being made of the same material as the plurality of magnetoresistance pattern portions,
   the plurality of magnetoresistance pattern portions being arranged in the first direction,
   each of the plurality of magnetoresistance pattern portions including a first resistance portion and a second resistance portion that are connected together in series,
   each of a plurality of the first resistance portions and a plurality of the second resistance portions included in the plurality of magnetoresistance pattern portions being formed in a second direction perpendicular to the first direction,
   each of the first wiring pattern portion and the second wiring pattern portion including a first wiring portion and a second wiring portion arranged on both sides of the plurality of magnetoresistance pattern portions in the second direction,
   two resistance portions included in the plurality of the first resistance portions and the plurality of the second resistance portions being located at both ends in the first direction,
   one of the two resistance portions connecting together the first wiring portion and the second wiring portion of the first wiring pattern portion,
   a remaining one of the two resistance portions connecting together the first wiring portion and the second wiring portion of the second wiring pattern portion.

2. The magnetic sensor of claim 1, wherein
   the plurality of the first resistance portions and the plurality of the second resistance portions are arranged side by side in the first direction, and
   in each of the plurality of magnetoresistance pattern portions,
   an outer edge of the first resistance portion in the first direction is formed in a shape that extends along an arc, of which a center is defined by a point on a centerline of the first resistance portion in the second direction, and
   an outer edge of the second resistance portion in the first direction is formed in a shape that extends along an arc, of which a center is defined by a point on a centerline of the second resistance portion in the second direction.

3. The magnetic sensor of claim 2, wherein
   the detection target is magnetized in the first direction in a predetermined cycle of magnetization, and
   in each of the plurality of magnetoresistance pattern portions, a radius of the arc of the first resistance portion and a radius of the arc of the second resistance portion are each equal to or less than 70% of the cycle of magnetization.

4. The magnetic sensor of claim 3, wherein
   each of the radii is equal to or greater than 30% of the cycle of magnetization.

5. The magnetic sensor of claim 3, wherein
   in each of the plurality of magnetoresistance pattern portions,
   the first resistance portion and the second resistance portion are spaced from each other in the first direction by a distance that is one half as long as the cycle of magnetization.

6. The magnetic sensor of claim 1, wherein
   each of the plurality of the first resistance portions and the plurality of the second resistance portions is formed in a meandering shape when viewed in a third direction perpendicular to both the first direction and the second direction.

7. The magnetic sensor of claim 1, wherein
   at least respective inner resistance portions out of the plurality of the first resistance portions and the plurality of the second resistance portions are formed in an identical shape when viewed in a third direction perpendicular to both the first direction and the second direction.

8. The magnetic sensor of claim 1, comprising four magnetoresistance pattern portions as the plurality of magnetoresistance pattern portions, wherein
   the bridge circuit is a full bridge circuit formed by the four magnetoresistance pattern portions.

9. The magnetic sensor of claim 8, further comprising:
   a third wiring pattern portion connected to a first output terminal; and
   a fourth wiring pattern portion connected to a second output terminal, wherein
   the third wiring pattern portion is connected to a connection node between two magnetoresistance pattern portions, which are connected together in series, out of the four magnetoresistance pattern portions, and
   the fourth wiring pattern portion is connected to a connection node between remaining two magnetoresistance pattern portions, other than the two magnetoresistance pattern portions, out of the four magnetoresistance pattern portions.

10. The magnetic sensor of claim 8, further comprising:
    a third wiring pattern portion connected to a first output terminal; and
    a fourth wiring pattern portion connected to a second output terminal, wherein
    the four magnetoresistance pattern portions consist of:
    a first magnetoresistance pattern portion and a second magnetoresistance pattern portion which are connected together in series; and
    a third magnetoresistance pattern portion and a fourth magnetoresistance pattern portion which are connected together in series,
    the first wiring pattern portion is connected to one end portion, located opposite from another end portion adjacent to the second magnetoresistance pattern portion, of the first magnetoresistance pattern portion and one end portion, located opposite from another end portion adjacent to the fourth magnetoresistance pattern portion, of the third magnetoresistance pattern portion,
    the second wiring pattern portion is connected to one end portion, located opposite from another end portion adjacent to the first magnetoresistance pattern portion, of the second magnetoresistance pattern portion and one end portion, located opposite from another end portion adjacent to the third magnetoresistance pattern portion, of the fourth magnetoresistance pattern portion, the third wiring pattern portion is connected to the first magnetoresistance pattern portion and the second magnetoresistance pattern portion, and the fourth wiring pattern portion is connected to the third magnetoresistance pattern portion and the fourth magnetoresistance pattern portion.

* * * * *